(12) United States Patent
Bowen

(10) Patent No.: US 8,274,478 B2
(45) Date of Patent: Sep. 25, 2012

(54) TELEPHONE KEYPAD WITH MULTIDIRECTIONAL KEYS

(76) Inventor: James Harrison Bowen, Elizabeth City, NC (US)

( * ) Notice: Subject to any disclaimer, the term of this patent is extended or adjusted under 35 U.S.C. 154(b) by 62 days.

(21) Appl. No.: 13/151,864

(22) Filed: Jun. 2, 2011

(65) Prior Publication Data

US 2011/0248925 A1 Oct. 13, 2011

Related U.S. Application Data

(63) Continuation of application No. 11/980,243, filed on Oct. 31, 2007, now abandoned, which is a continuation-in-part of application No. 11/189,957, filed on Jul. 27, 2005, now Pat. No. 7,855,715.

(51) Int. Cl.
*G06F 3/02* (2006.01)
*B41J 5/00* (2006.01)

(52) U.S. Cl. ............... 345/168; 400/485; 345/170

(58) Field of Classification Search .......... 341/22–23; 348/734; 715/701–715; 345/168–172, 173, 345/520; 178/17 A, 17 C, 18.01; 400/485–486; 379/368–369

See application file for complete search history.

(56) References Cited

U.S. PATENT DOCUMENTS

| | | | |
|---|---|---|---|
| 4,311,990 A * | 1/1982 | Burke | 341/31 |
| 4,362,934 A * | 12/1982 | McLey | 250/229 |
| 5,237,123 A | 8/1993 | Miller | |
| 5,278,557 A | 1/1994 | Stokes et al. | |
| 5,502,460 A | 3/1996 | Bowen | |
| 5,528,235 A | 6/1996 | Lin et al. | |
| 5,557,057 A | 9/1996 | Starr | |
| 5,567,902 A | 10/1996 | Kimble et al. | |
| 5,619,003 A | 4/1997 | Hotz | |
| 5,644,338 A | 7/1997 | Bowen | |
| 5,889,507 A | 3/1999 | Engle et al. | |
| 6,204,839 B1 | 3/2001 | Mato, Jr. | |
| 6,705,783 B1 | 3/2004 | Bowen | |
| 6,853,366 B2 | 2/2005 | Bowen | |
| 7,269,439 B2 | 9/2007 | Honda | |
| 2003/0020694 A1 | 1/2003 | Kim et al. | |
| 2003/0044215 A1 | 3/2003 | Monney et al. | |
| 2003/0094354 A1 * | 5/2003 | Badarneh | 200/18 |
| 2003/0107555 A1 | 6/2003 | Williams | |
| 2005/0057515 A1 | 3/2005 | Bathiche | |
| 2007/0182595 A1 * | 8/2007 | Ghasabian | 341/22 |

* cited by examiner

*Primary Examiner* — Albert Wong
*Assistant Examiner* — Jerold Murphy
(74) *Attorney, Agent, or Firm* — Whitham Curtis Christofferson & Cook, PC

(57) ABSTRACT

A telephone keypad for one touch text messaging the QWERTY pattern of keys in a matrix of nine keys. Using the multi position biasing keys only one touch is needed for each character, so in use to input the letter "C" you touch one key one time, decreasing the time spend text messaging from cell phones or desk tops and dialing phone numbers advertised in letters. The keypad also has a shift key to get upper case included in the nine keys, and a $2^{nd}$ key to double functionality of the keys.

5 Claims, 24 Drawing Sheets

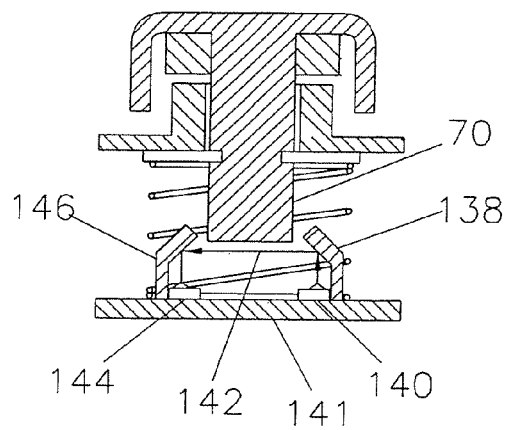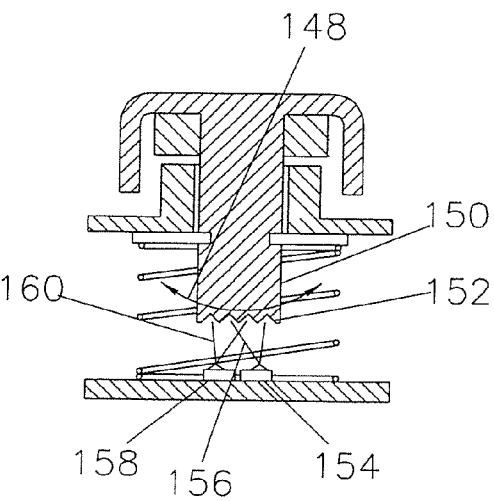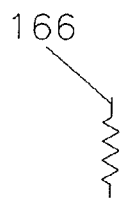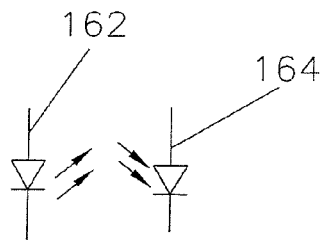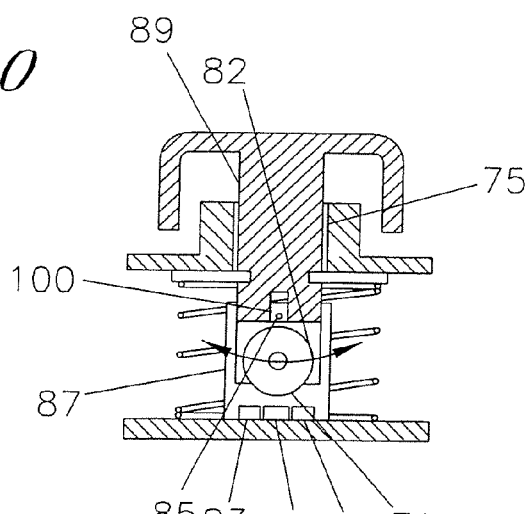
FIG. 17
FIG. 18
FIG. 20
FIG. 19
FIG. 21

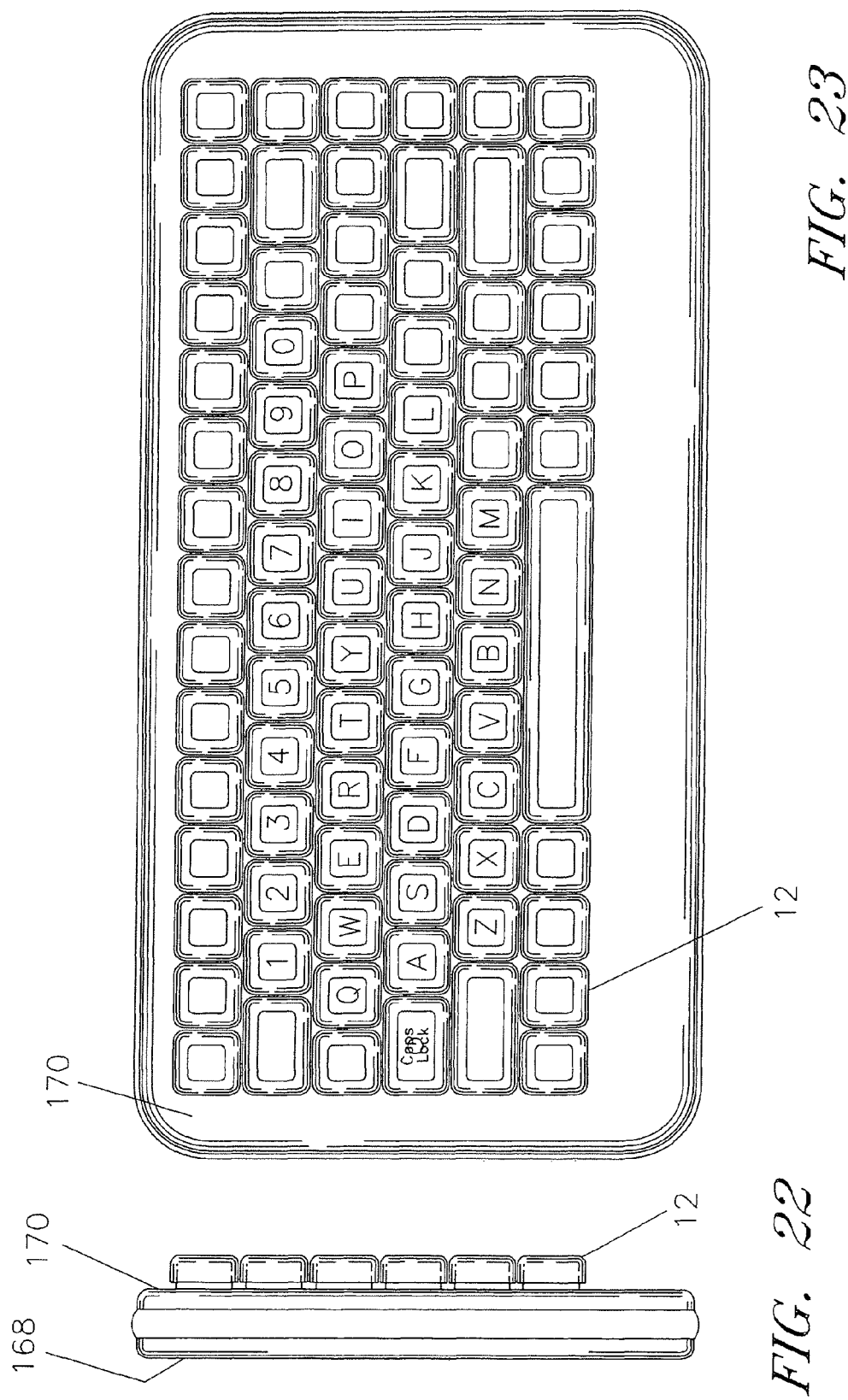

TELEPHONE KEYPAD WITH MULTIDIRECTIONAL KEYS

CROSS-REFERENCES TO RELATED APPLICATION

This application is a continuation application of U.S. patent application Ser. No. 11/980,243 filed Oct. 31, 2007, now abandoned, which itself is a continuation-in-part (CEP) application of the patent application having U.S. Ser. No. 11/189,957 filed on Jul. 27, 2005 now U.S. Pat. No. 7,855, 715. The completed contents of the above-identified patent applications being herein incorporated by reference.

CROSS-REFERENCES TO RELATED PATENTS

Design of the optical switch with depth and lateral articulation used in the practice of this invention can be as disclosed in U.S. Pat. Nos. 6,705,783, 6,853,366, 5,502,460 and 5,644,338 in which are herein incorporated by reference.

BACKGROUND OF THE INVENTION

1. Field of the Invention

The present invention generally relates to a switch to be used in mobile devices where a limited number of keys can facilitate the same key outputs of regular full key QWERTY keyboards, and wherein the switch is slid or biased to the side to input a character so downward pressure in handling of the mobile or desk top device will not actuate the switch facilitating one touch per character text messaging is achieved.

2. Description of the Prior Art

Mobil and desk top telephones to date use an arrangement of 0 through 9 numbers with the letters on each of the number keys arranged A, B, C, D, E, where to input a "C" an operator must touch the two 2 key three times. The keys are also of the compression type so if something is laid on them or they are grabbed from a pocket an input can be made.

U.S. Pat. No. 5,528,235, Lin et al, shows a key that can be depressed on each of its four sides to give an output.

Thumb boards to date used for mobile communications are either standalone and plugged into other mobile devices or are built into mobile communication devices.

SUMMARY OF THE INVENTION

It is therefore the primary objective of this invention when used in a desk top or mobile device to allow the user a QWERTY keyboard in a small keyboard where depending on key arrangement can be only three columns by three rows of keys that if a key depressed will not give an input. Also using the multi position biasing keys as in FIG. 31, FIG. 32, FIG. 41 and in FIG. 37 only one touch, or slightly biasing the key in one direction, is used for each character, so in use to input the letter "C" you bias the character 7 key toward the front one time, decreasing the time spend text messaging, dialing phone numbers advertised in letters, or text messaging from desk tops. This invention the letters are more advantageously placed in the more familiar QWERTY pattern making it easier to input characters faster.

It is a further objective of this invention in rugged applications to have an optical sensor with a sensing means for a switch position that is not in contact with the switch interrupter being positionally sensed making the operation of the switch rugged and impervious to a striking or operating force.

It is a further objective of this invention to have an optical sensor sense with lateral articulation to enable a multiple directional selection of various computer or mobile communication device input functions.

It is a further objective of this invention to reduce the number of keys in a more standard QWERTY keyboard, thumb board or other mobile communications device, and to allow a standard desk top telephone to have a QWERTY keyboard with only nine keys.

Briefly, this invention contemplates having at least one key interrupter wherein the interrupter is banked by at least one optically emitter detector pair with an optical beam there between. The key interrupter blocks or partially blocks the optical beam giving key location detection thus eliminating contact with the sensing means. The key can be articulated in a lateral or sideward direction to vary the optical beam emission to the detector to input characters.

BRIEF DESCRIPTION OF THE DRAWINGS

The foregoing and other objects, aspects and advantages will be better understood from the following detailed description of the invention with reference to the drawings, in which:

FIG. 17 is a section view of an optical switch with mirrors to direct the optical beam in accordance with the teachings of this invention;

FIG. 18 is a section view of an optical switch with a serrated lower key stem to detect position and change in lateral position of the key stem in accordance with the teachings of this invention;

FIG. 19 is an electrical schematic of an optical switch in accordance with the teachings of this invention;

FIG. 20 is an electrical schematic of a pressure sensitive switch in accordance with the teachings of this invention;

FIG. 21 is a section view of a switch with optical and pressure sensing elements for downward detection and low resistance roller for lateral detection in accordance with the teachings of this invention;

FIG. 22 is a side view of a keyboard with optical key detection in accordance with the teachings of this invention;

FIG. 23 is a plan view of a keyboard with optical key detection in accordance with the teachings of this invention;

DETAILED DESCRIPTION OF THE INVENTION

Figure 1:
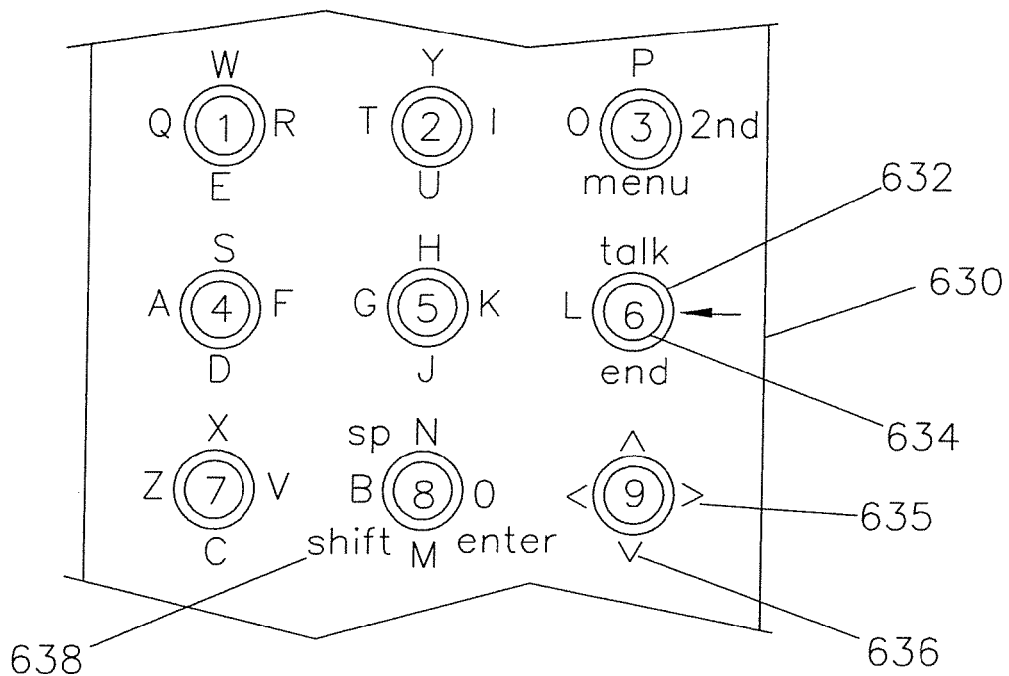
FIG. 1 is a view of a nine key QWERTY keyboard with indicia on the housing in accordance with the teachings of this invention.

Referring now to the drawings, in which the same reference numeral indicates the same element in the various figures, FIG. 1 shows a pattern of keys in housing 630 to be used on any type of device that needs a compact keyboard. Housing 630 shows multidirectional keys 634 in key opening 632 with all of the alpha QWERTY keys in a regular QWERTY keyboard but only having nine keys. A reference for a more standard QWERTY keyboard is shown in FIG. 23. The keys of FIG. 1 are not in a standard telephone keypad arrangement of A, B, C, D, E, where to input a C an operator must touch the key three times. Being very advantageously marked with indicia they are in the more familiar QWERTY pattern making it easier to type faster. And using the multi position sliding keys as in FIG. 31, FIG. 32, FIG. 37 and in FIG. 41 only one touch, or sliding the key in one direction is used for each character meaning if you want to input the letter "C" you slide the character 7 key toward the front one time. Further shown in FIG. 1 is some indicia is on housing 630 and some is on multidirectional keys 634 allowing for the indicia on the housing to be larger and more easily read. Down arrow indicia 636 and side arrow indicia 635 shows that this key can be used as a cursor positioning key wherein the detection is further shown in FIG. 11, FIG. 25, FIG. 36, and FIG. 39. SHIFT indicia 638 shows that the keys can move and be detected in multidirectional positions also shown in FIG. 11, FIG. 25, FIG. 36, and FIG. 39. Further shown in FIG. 1 SHIFT indicia 638 is a direction that you position that associated key in, then another key and that key is then shifted, the number keys would also be shifted to the symbol above each number. Further in FIG. 1 there is a $2^{nd}$ key that when touched it can be used to change whether an operator input numbers or letters, or other functions depending on the application, it can also be used to change certain keys to arrows for moving around on a display like down arrow indicia 636. In an application where the device is used mainly for dialing a phone number the device can have a menu that enables numbers first, then touch $2^{nd}$ and get letters and it could stay in $2^{nd}$ inputting letters until the $2^{nd}$ is touched again to input numbers. Or if the application requires letters first it enables letters first and touch $2^{nd}$ and get numbers. Obviously those skilled in the art can appreciate different functions as a result of touching the shift and or $2^{nd}$ key.

Figure 1A:
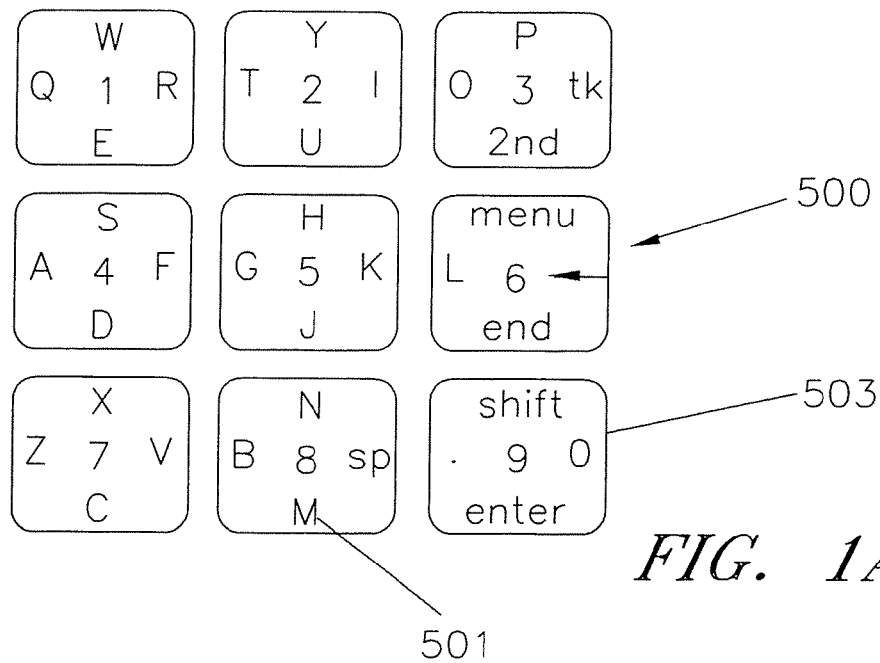
FIG. 1A is a view of a nine key QWERTY keyboard with indicia on the keys in accordance with the teachings of this invention.

FIG. 1A shows a pattern of keys 500 to be used on any type of device that needs a compact keyboard, pattern of keys 500 with one of the key pattern key 503 shows all of the alpha QWERTY keys with key indicia 501 in a regular QWERTY keyboard but only having nine keys. A reference for a more standard QWERTY keyboard is shown in FIG. 23. The keys of FIG. 1 are not in a standard telephone keypad arrangement of A, B, C, D, E, where to input a C an operator must touch the key three times. Being very advantageous they are in the more familiar QWERTY pattern making it easier to type faster. And using the multidirectional sliding keys as in FIG. 31, FIG. 32 and in FIG. 37 only one touch, or sliding the key in one direction, is used for each character meaning if you want to input the letter "C" you slide the character 7 key toward the front one time. Further shown in FIG. 1 is a SHIFT key, where you touch that key, then another key and that key is shifted, the number keys would also be shifted to the symbol above each number. Further in FIG. 1 there is a $2^{nd}$ key that when touched it can be used to change whether an operator input numbers or letters, or other functions depending on the application, it can also be used to change certain keys to arrows for moving around on a display. In an application where the device is used mainly for dialing a phone number the device can have a menu that enables numbers first, then touch $2^{nd}$ and get letters and it could stay in $2^{nd}$ inputting letters until the $2^{nd}$ is touched again to input numbers. Or if the application requires letters first it enables letters first and touch $2^{nd}$ and get numbers. Obviously those skilled in the art can appreciate different functions as a result of touching the shift and or $2^{nd}$ key.

Figure 2:
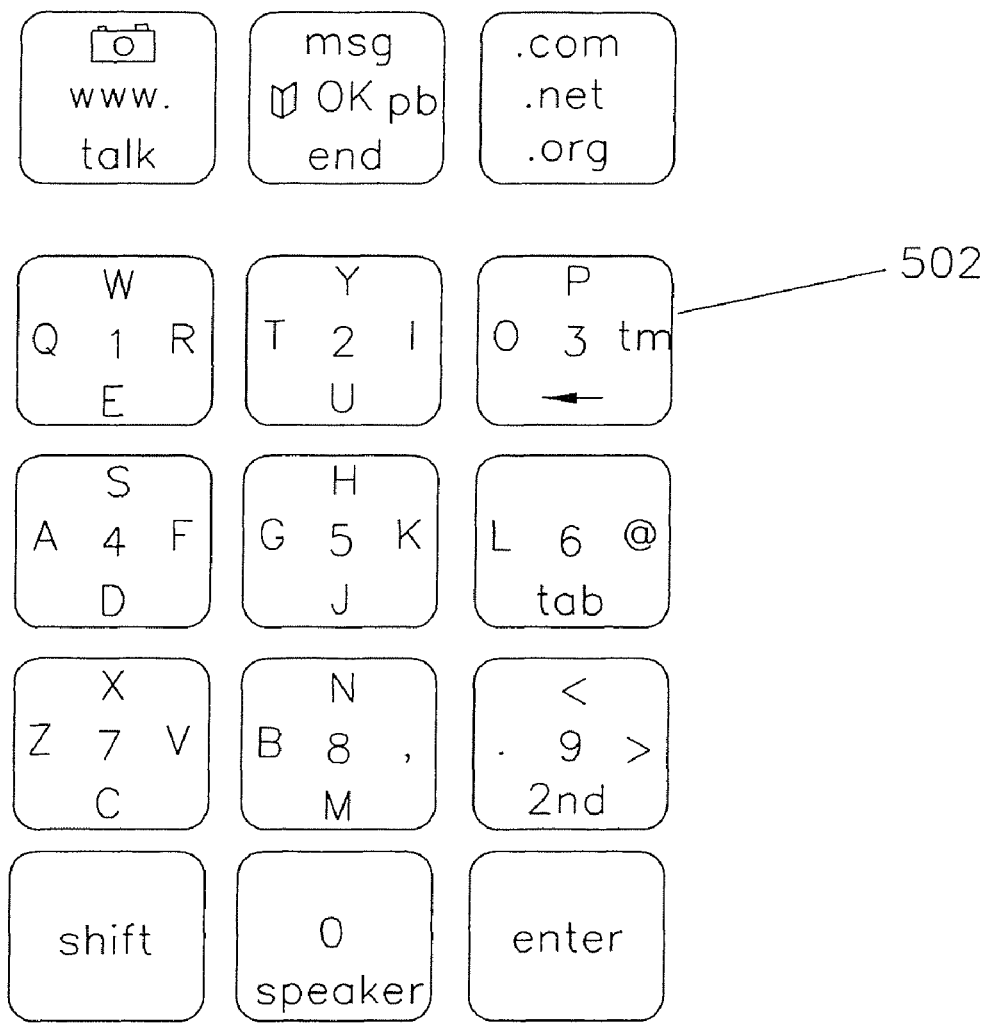
FIG. 2 is a view of a fifteen QWERTY keyboard in accordance with the teachings of this invention.

FIG. 2 shows a larger key pattern 502 for devices that have room for more keys and functions.

Figure 3:
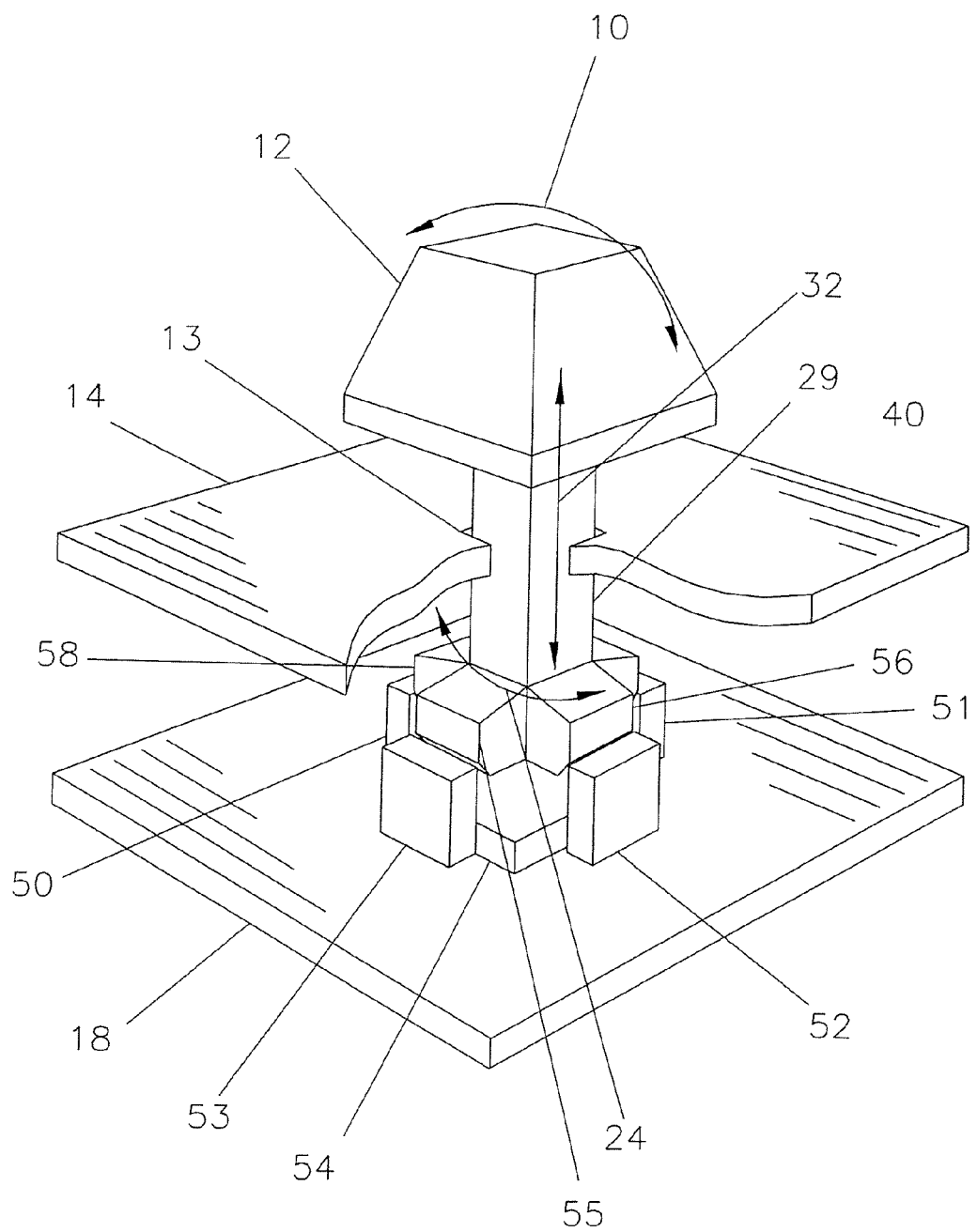
FIG. 3 is an isometric view of a switch having a key and stem protruding through a pivot and sliding surface with force sensitive elements for position, lateral and bilateral detection in accordance with the teachings of this invention.

FIG. 3 shows a switch in systems that do not require the rugged optical elements, shown with lower force sensing element 54 for depth, acceleration and velocity measurements flanked by left side pressure sensing element 50 and right side pressure sensing element 52 to be pressured by left force member 58 and right force member 56 when key stem 29 is moved or oscillated in the direction of lower lateral arrow 24. Bilateral pressure sensing element 53 to be pressured by side force member 55 can be perpendicular to left side pressure sensitive element 50 and right side pressure sensitive element 52 and opposed by a second bilateral pressure sensing element 51. When the application necessitates multi lateral detection for input data to a host computer or the like this arrangement of four pressure sensitive elements is advantageous. But any one of the four can be used when singular lateral detection is only needed. It should be appreciated that those skilled in the art that there are different force sensing elements to name two are resistive and capacitive either or others could be used, and in conjunction with position sensing elements like hall effect sensors, magnet sensors and RF based sensors.

Figure 4:
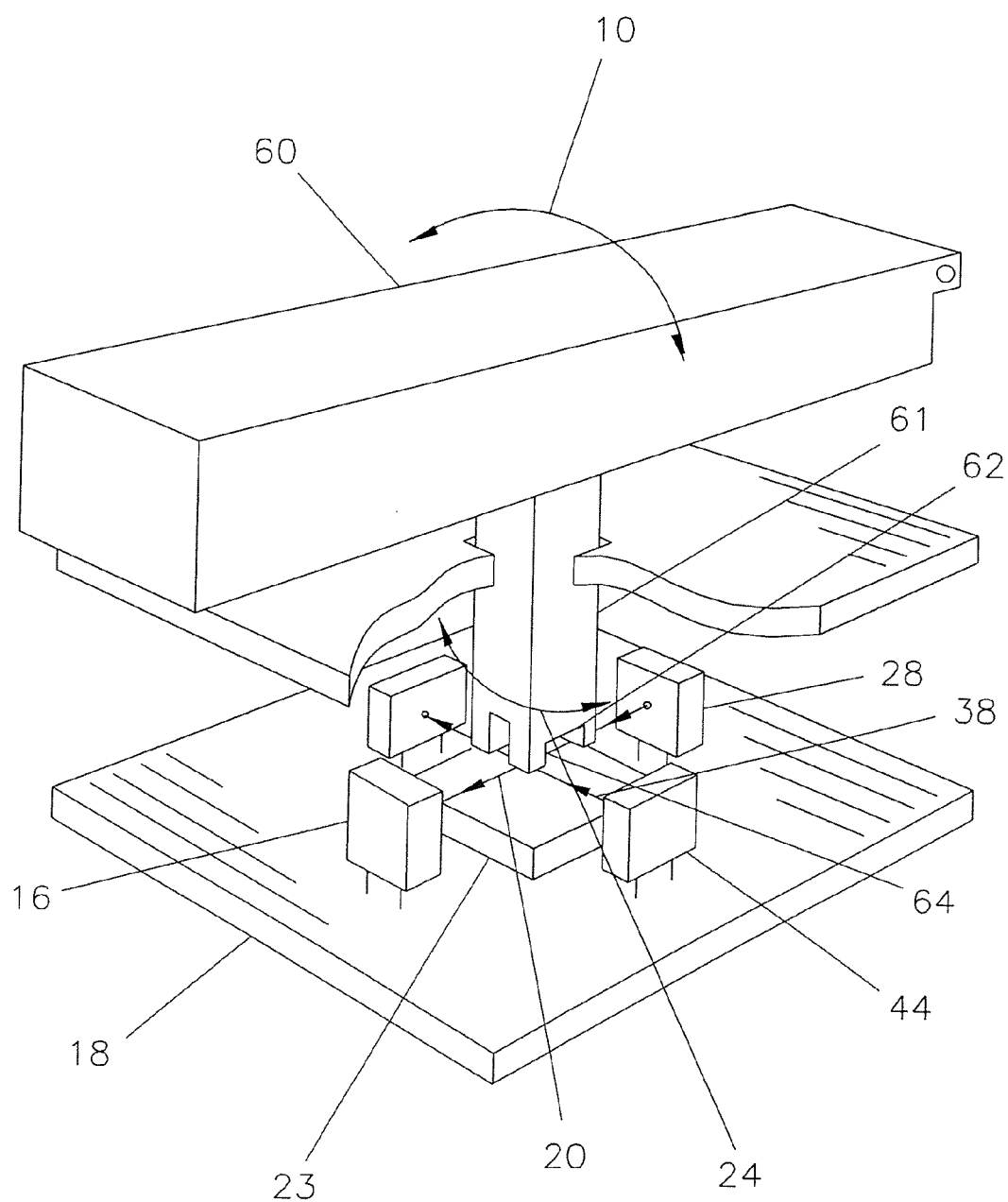
FIG. 4 is an isometric view of a optical switch having a musical key and stem protruding through a pivot and sliding surface with separate optical position and sideward detection and a tension element for resistance in a downward direction in accordance with the teachings of this invention.

FIG. 4 shows a musical key 60 being used to position stem 61. Optical slot 64 is made wide as not to attenuate second optical beam 38 enabling in the up down direction to be attenuated by optical slot top 62 in key stem 61, and can have pressure resistive pad 23 if resistance to downward key motion is desired. If another output function is needed pressure resistive element 23 can be pressure sensitive so when pressed sending other codes depending on the application. This is advantageous so there is only one optical beam per function facilitating less computation, like a first function could be up down and a second function be side ward or lateral for vibrato and other inputs.

Figure 5:
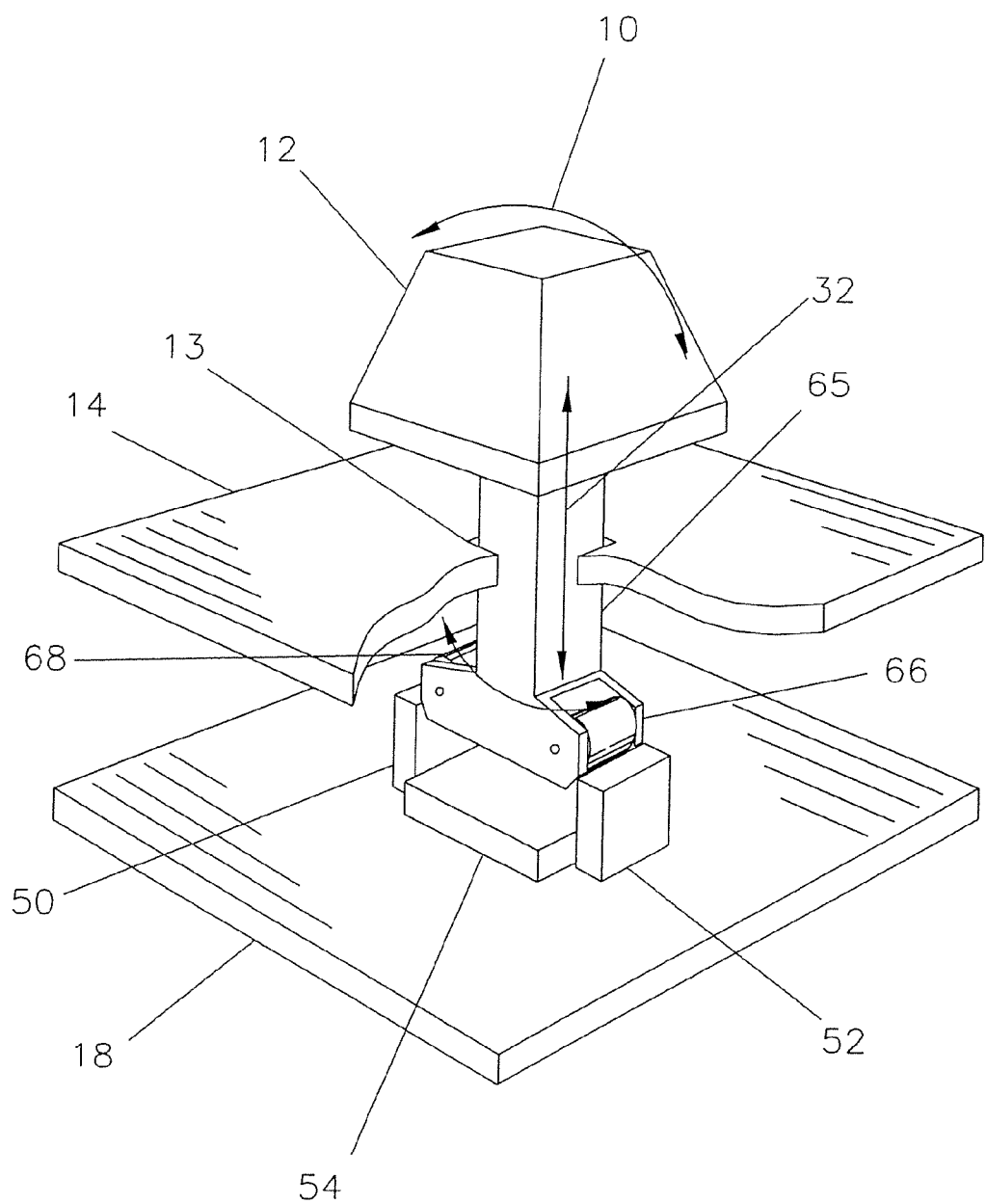
FIG. 5 is an isometric view of a switch having a key and stem protruding through a pivot and sliding surface with force sensitive elements for position and sideward detection with roller contact in accordance with the teachings of this invention.

FIG. 5 shows a switch in systems that is more rugged than the switch in FIG. 3 by having the addition of low resistant rollers for side ward pressure. Lower force sensing element 54 for being used for depth, acceleration and velocity measurements flanked by left side force sensing element 50 and right side force sensing element 52 to be pressured by left force roller 68 and right force roller 66 when stem 30 is moved or oscillated in the direction of lower lateral arrow 24.

Figure 6:
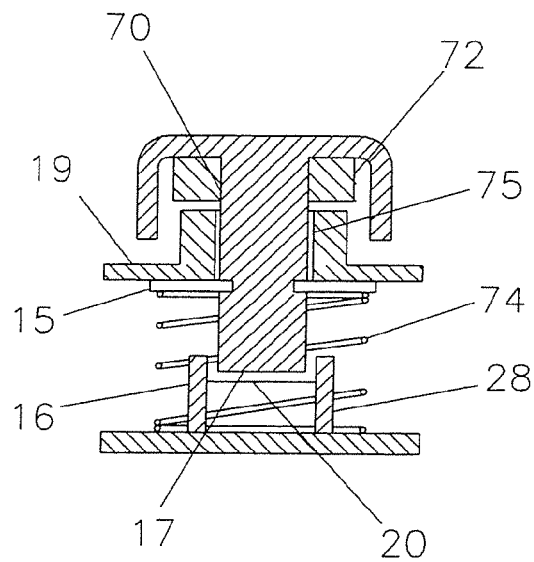
FIG. 6 is a section view through the a switch showing the key stem starting into optical detection in accordance with the teachings of this invention.

FIG. 6 is a section view of a switch that has the elastomeric material under the key cap. Key stem 70 being pivotably and slideably received in pivot and sliding surface 19 is shown before optical beam 20 is attenuated by lower surface 17 of key stem 70. Elastomer pad 72 is shown prior to contacting pivot and sliding opening 75. Key stem spring 74 holds key stem in an up position being restrained in the up direction by key stem retainer 15 awaiting depression from an operator.

Figure 7:
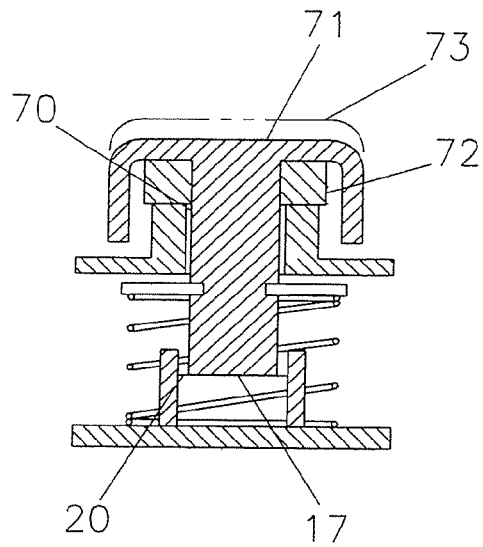
FIG. 7 is a section view through a switch showing the key stem at a mid point through optical detection starting to contact the tension element resistance in accordance with the teachings of this invention.

FIG. 7 is a section view of a switch with lower surface 17 in a mid position attenuating optical beam 20, and in first contact with elastomer pad 72. Phantom line 73 shows the starting or up position of key cap 71.

Figure 8:
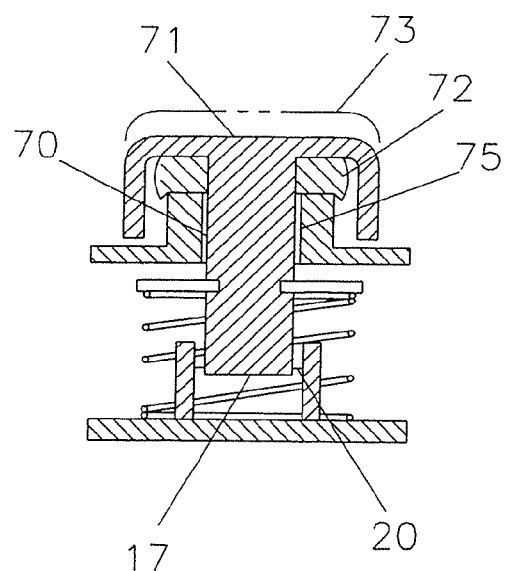
FIG. 8 is a section view through a switch showing the key stem through optical detection and in full contact with the tension element resistance in accordance with the teachings of this invention.

FIG. 8 is a section view of a switch with key cap 71 reaching the extent of downward travel of key stem 70 compressing elastomer pad 72 and lower surface 17 further attenuating optical beam 20.

Figure 9:
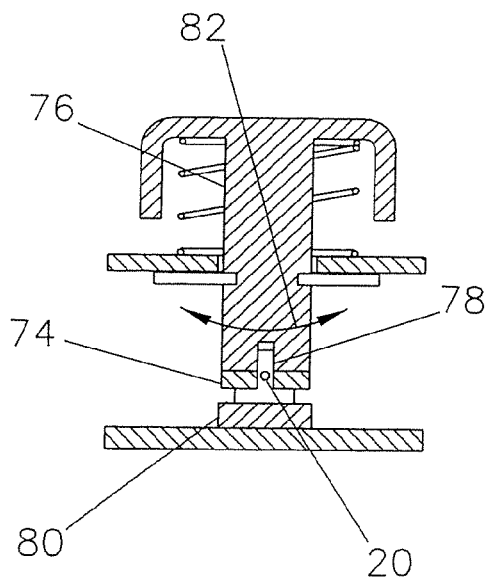
FIG. 9 is a section view through a switch with position force sensing element and optical sideward detection in accordance with the teachings of this invention.

FIG. 9 is a section view of a switch that uses optical lateral or vibrato detection and a force sensing element for depth, acceleration and velocity. Key stem 76 is shown in an up position with optical beam 20 being straddled by optical opening 78. Whereas when lateral movement is made by key stem 76 shown by lateral arrow 82 optical beam 20 is attenuated by the sides of optical opening 78 to be calculated by electronic circuit as shown in FIG. 26 and flow chart in FIG. 25 to give distance, velocity and cycle times. Pressure foot 74 will contact force sensing element 80 when key stem 76 is in a down position. Pressure foot 74 can be an elastomer of other spring type material. This is advantageous to give better sideward or lateral movement control in applications that want lower pressure for vibrato when in constant contact with force sensitive element 80.

It is known in the art that FSR's have a force verses resistance relationship such as 0.35 oz. with 10 ohms resistance, 3.57 oz. with 10K ohms resistance or otherwise a direct relationship, but the distance of travel to obtain this resistance change is virtually zero. So it can be advantageous to use an elastomeric pad to contact the pressure sensitive element and although the change in resistance is not as great, the durometer of the elastomeric pad allows for more distance to be traveled by the key stem giving a better feel and protecting the FSR from damage resulting from severe force.

Figure 10:
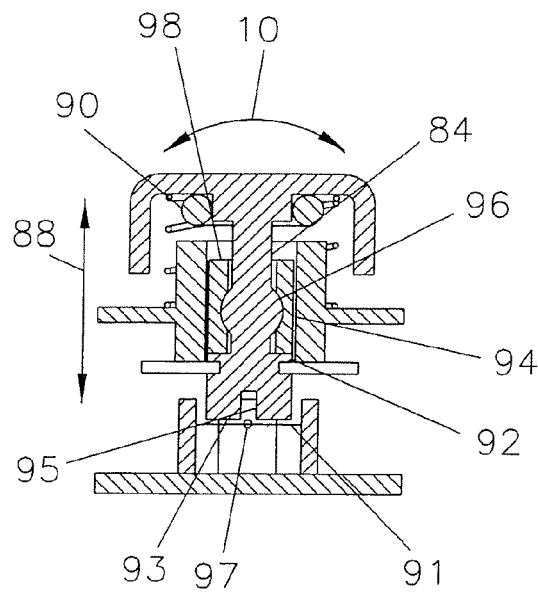
FIG. 10 is a section through an optical switch having a key and stem protruding through a pivot and sliding surface with separate optical position and sideward detection and an elastomeric resistance with a low resistance sideward articulation ball mechanism in accordance with the teachings of this invention.

FIG. 10 is a section view of a switch in which key stem 84 has a pivot ball 96 to allow full sideward articulation in 360 degrees. Ball slide 98 slides up and down in pivot and sliding opening 94 as shown by up and down arrow 88. Key stem lower surface 93 attenuates optical beam 91 in the up down direction. The sides of optical opening 95 attenuates crossing optical beam 97 in the direction of upper lateral arrow 10. Alignment surface 92 is nested in pivot and sliding opening 94 keeping key stem 84 in a neutral position until key stem 84 is pressed in a down direction allow articulation of key stem 84 about pivot ball 96. Elastomer pad O-ring 90 is shown to limit downward travel and to give resistance to the movement of key stem 84.

Figure 11:
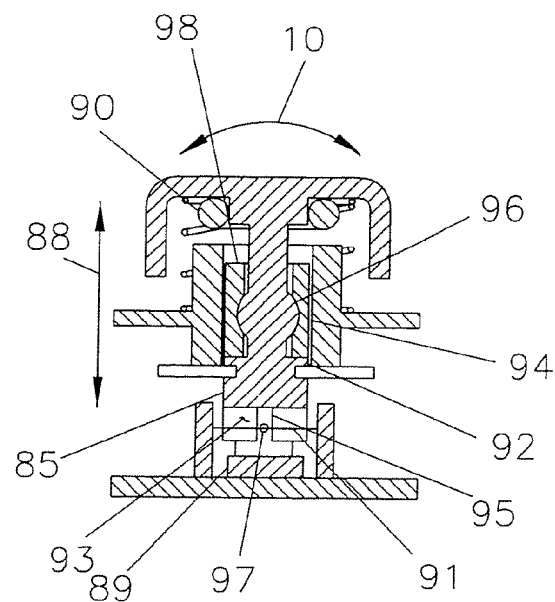
FIG. 11 is a section through an optical switch having a key and stem protruding through a pivot and sliding surface with bi-directional sideward or lateral detection and an elastomeric resistance with a low resistance sideward articulation ball mechanism with pressure sensing downward detection in accordance with the teachings of this invention.

FIG. 11 is a section view of a switch showing similar elements of FIG. 10 but key stem 85 is longer and remains in optical beam 91 and crossing optical beam 97. Optical opening 95 and crossing optical opening 93 straddling optical beam 91 and crossing optical beam 97 unattenuating each until lateral articulation is started. By having two crossing optical beams being articulated triangulation can be made to direct a cursor or other computer function with a small amount of force. Alignment surface 92 as explained in FIG. 10 is optional depending on designer preference in as much as if alignment surface 92 is used then an operator moving their fingers over the key surface will not allow any attenuation of position, attenuation will only occur after depressing key stem 85 thus releasing movement to allow attenuation. Then if alignment surface 92 is not there then attenuation of position can be at anytime the key stem 85 is moved. Force sensing element 89 detects the up down key position with varying pressure from key stem 85.

Figure 12:
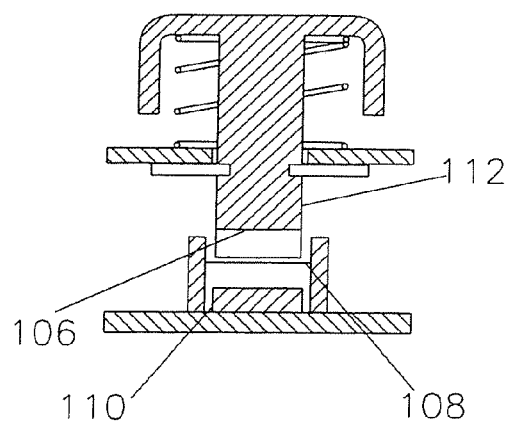
FIG. 12 is a cross section view of a optical switch having a key and stem protruding through a pivot and sliding surface with optical position and sideward detection and an elastomeric resistance in a downward direction beneath the stem in accordance with the teachings of this invention.

FIG. 12 is a section view of a switch showing key stem 112 in an up position prior to attenuating optical beam 108 with optical slot top 106.

Figure 13:
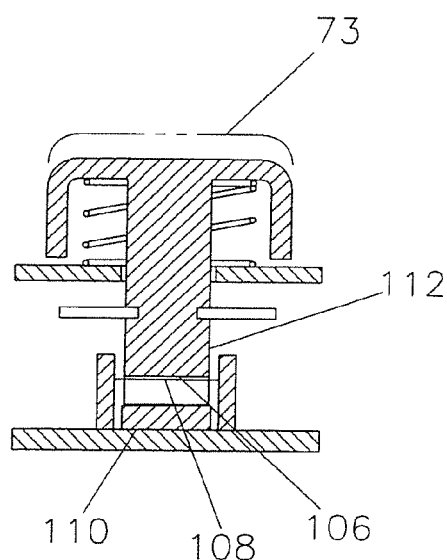
FIG. 13 is a section view of a optical switch in a depressed position having a key and stem protruding through a pivot and sliding surface with optical position and sideward detection and a tension element for resistance in a downward direction beneath the stem in accordance with the teachings of this invention.

FIG. 13 is a section view of a switch of FIG. 12 showing key stem 112 in a downward position from phantom line 73 attenuating optical beam 108 with optical slot top 106 and in first contact with elastomeric pad 110. It should be appreciated that key stem 112 could also have roller contact 79 like is shown in FIG. 21 to reduce the lateral force being applied to key stem 112 while in contact with elastomeric pad 110.

Figure 14:
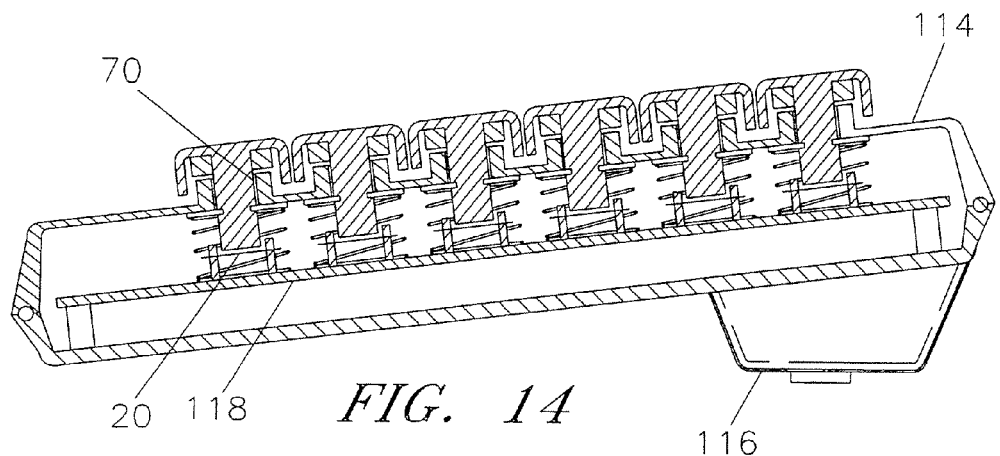
FIG. 14 is a cross section through a computer or musical keyboard showing multiple optical switches in accordance with the teachings of this invention.

FIG. 14 is a section view of a keyboard showing the switch of FIG. 6 in plurality. With key stem 70, optical beam 20, printed wiring board 118 being housed in upper housing 114 and lower housing 116. Having a plurality of switches allows the keyboard to be used for various functions as in input computer codes to a host, position a cursor, input cursor left, right and scroll codes to a host, input Musical Instrument Digital Interface (MIDI) commands for playing music, or input computer codes for playing music on a PC.

Figure 15:
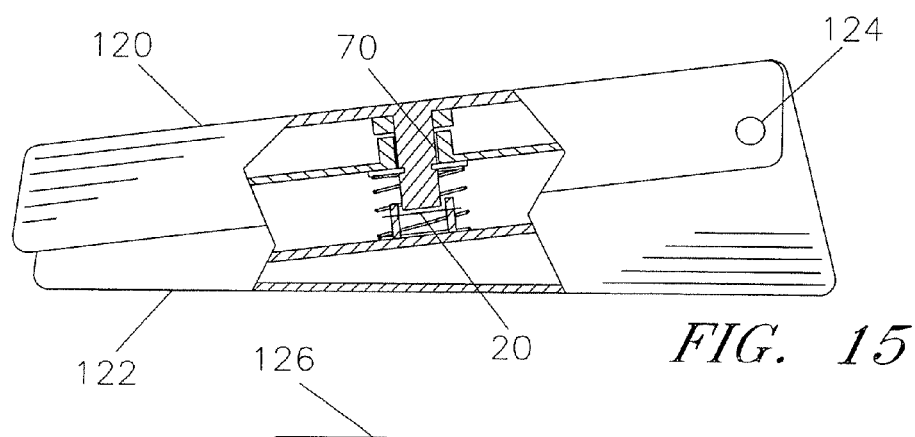
FIG. 15 is a partial section view through an optical foot switch in accordance with the teachings of this invention.

FIG. 15 is a partial section view of a foot switch or foot pedal having key stem 70 and optical beam 20 housed within upper moveable housing 120 and lower housing 122 with pivot 124 there between to allow movement of key stem 70 through optical beam 20 wherein movement can be varied by depressing upper housing 120 to vary the output resultant from attenuating optical beam 20.

Figure 16:
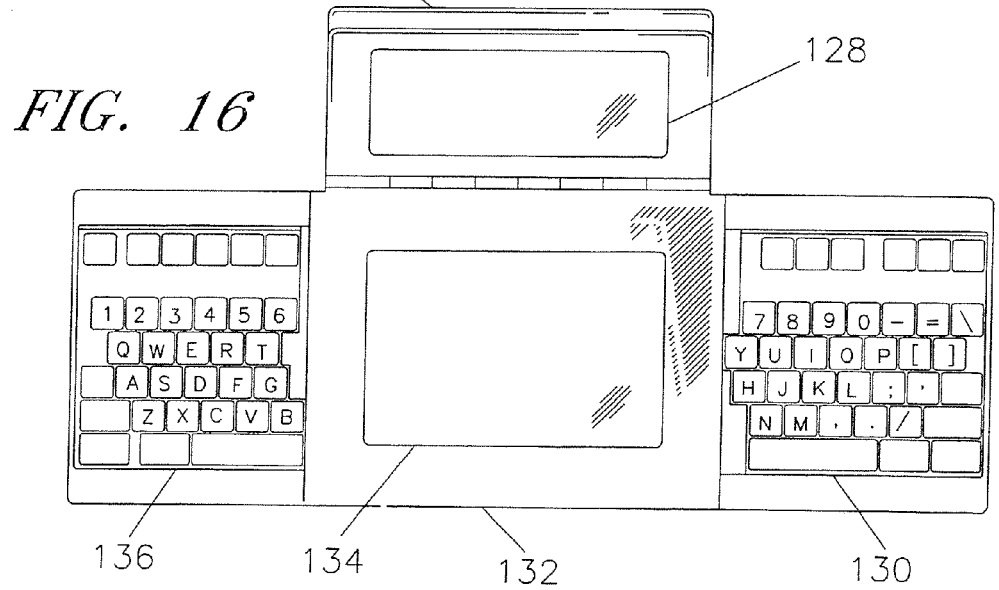
FIG. 16 is a plan view of a dual screen notebook computer with a velocity, acceleration, and lateral detection keys used in a split keyboard in accordance with the teachings of this invention.

FIG. 16 shows a notebook computer with rear display 128 mounted in rear housing 126 attached to lower housing 132 laterally adjoined by left side articulated key keyboard 136 and right side articulated key keyboard 130 which can be fitted with any of the key switches heretofore mentioned. A separate mouse positioning apparatus is not needed because any one or more of the keys can have mouse like articulation heretofore mentioned in delineation of FIG. 2 and FIG. 11. Lower display 134 is disposed on lower housing 132. The arrangement of keys is split at a point to optimize typing or use of the keyboard. This is also an ergonomically advantageous of keys and display to keep your wrist straight, and if you are typing or playing music your reference material, sheet music, or the like can be placed on lower display 134 to keep your neck straight and avoid looking to the side. Left side articulated key keyboard 136 and right side articulated key keyboard 130 can in a fixed position or if the notebook computer is going to be used for travel then they can be made to retract over lower display 134. In as much as FIG. 16 is presented as a notebook computer it should be appreciated that those skilled in the art could think of the notebook computer with very limited function as in just for playing music, or just a split keyboard for use with a computer or musical instrument with a surface for reference material like sheet music or web notes.

FIG. 17 shows a different arrangement for directing optical beam 142 being emitted from emitter 140 and being detected by detector 144. Using emitter mirror 138 and detector mirror 146 both emitter 140 and detector 144 can be surface mounted on printed wiring board 141 to facilitate high production assembly of the switch and or a keyboard.

FIG. 18 shows emitter 154 emitting a divergent optical beam 156 and being reflected by serrated detection surface 152 on the lower surface of key stem 150 and back through detector beam 160 to detector 158. When key 150 is moved in the approximate arc shown by lower arc 148 this movement attenuates the detector beam 160 and to show sideward or lateral movement of key stem 150. Downward detection can be made by the ever decreasing amount of optical beam incident on detector 158 as key stem gets closure to detector 158, this downward detection can be made with serrated detection surface 152 being a smooth surface.

FIG. 19 shows emitter 162 and detector 164 are the only electrical components needed in a singular optical key switch.

FIG. 20 shows pressure sensitive element 166 is the only electrical component needed in a singular pressure sensitive key switch. The pressure sensing element can be but not limited to pressure sensing resistor or a pressuring sensing capacitor type component, and as shown in FIG. 21 there can be multiple pressure sensors to sense lateral positions. And although only three are shown in FIG. 21 it is to be understood by those experienced in the art that more or less could be used to increase or decrease sensitivity in the lateral direction as shown by lateral lower arrow 82.

FIG. 21 is a section view of a switch with roller contact 79 to apply pressure to pressure sensitive element 81 and to allow lateral movement in the direction of lateral lower arrow 82 by key stem 89 being pivotably and slideably received in pivot and sliding surface 75 allowing the sides of optical opening 100 to attenuate optical beam 85 being emitted from emitter 87. As an option pressure sensitive element 81 can be flanked by left pressure sensitive element 83 and right pressure sensitive element 77 allowing when key stem 89 is laterally articulated roller contact 79 can apply pressure to left pressure sensitive element 83 or right pressure sensitive element 77 to output a vibrato type of output or a code or codes to a host. This is advantageous to allow lower pressure on a key or persons finger when laterally articulating. The width of the pressure sensing elements can be varied to better optimize either vibrato or computer key output movements. Pressure sensitive element 83 could also be an elastomeric pad like elastomeric pad 110 as in FIG. 13 when the downward direction is to be sensed by optical beam 85 eliminating the need for pressure sensitive elements. Optical opening 100 is a hole through key stem 89 with optical beam 85 there through can alternately be enabled after contact is made by roller contact 79 on pressure sensitive 81 to lesson any ambiguous attenuation of optical beam 85.

The downward direction can also be sensed by pressure sensitive element 81 and in the lateral direction by lateral signature detection whereas the rolling effect is measured and results to be different than a singular downward pressure.

FIG. 22 is a side view of the keyboard showed in FIG. 22 showing key cap 12, upper housing 170 and lower housing 168.

FIG. 23 is a plan view of a keyboard showing key cap 12 and upper housing 170 can have a plurality of keys for computer input to either playing music or normal operation of a PC. The pattern number of keys can be varied to match a particular application.

Figure 24:
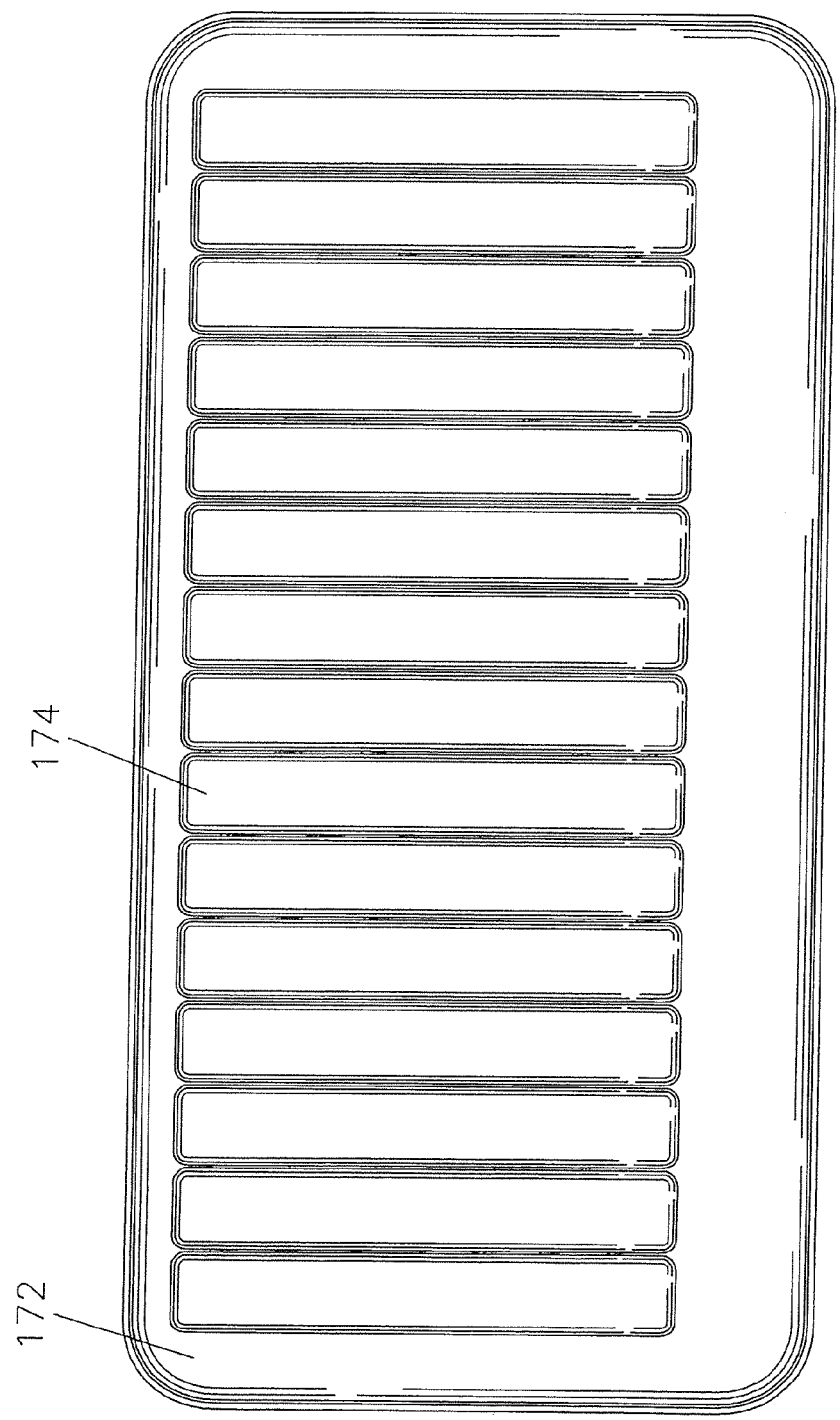
FIG. 24 is a plan view of a musical keyboard with optical key detection in accordance with the teachings of this invention.

FIG. 24 is a plan view of a keyboard with a long key 174 and upper housing 172 with a musical pattern of keys. The number of keys can be varied to match a particular set of notes or have a piano set of 88.

Figure 25:
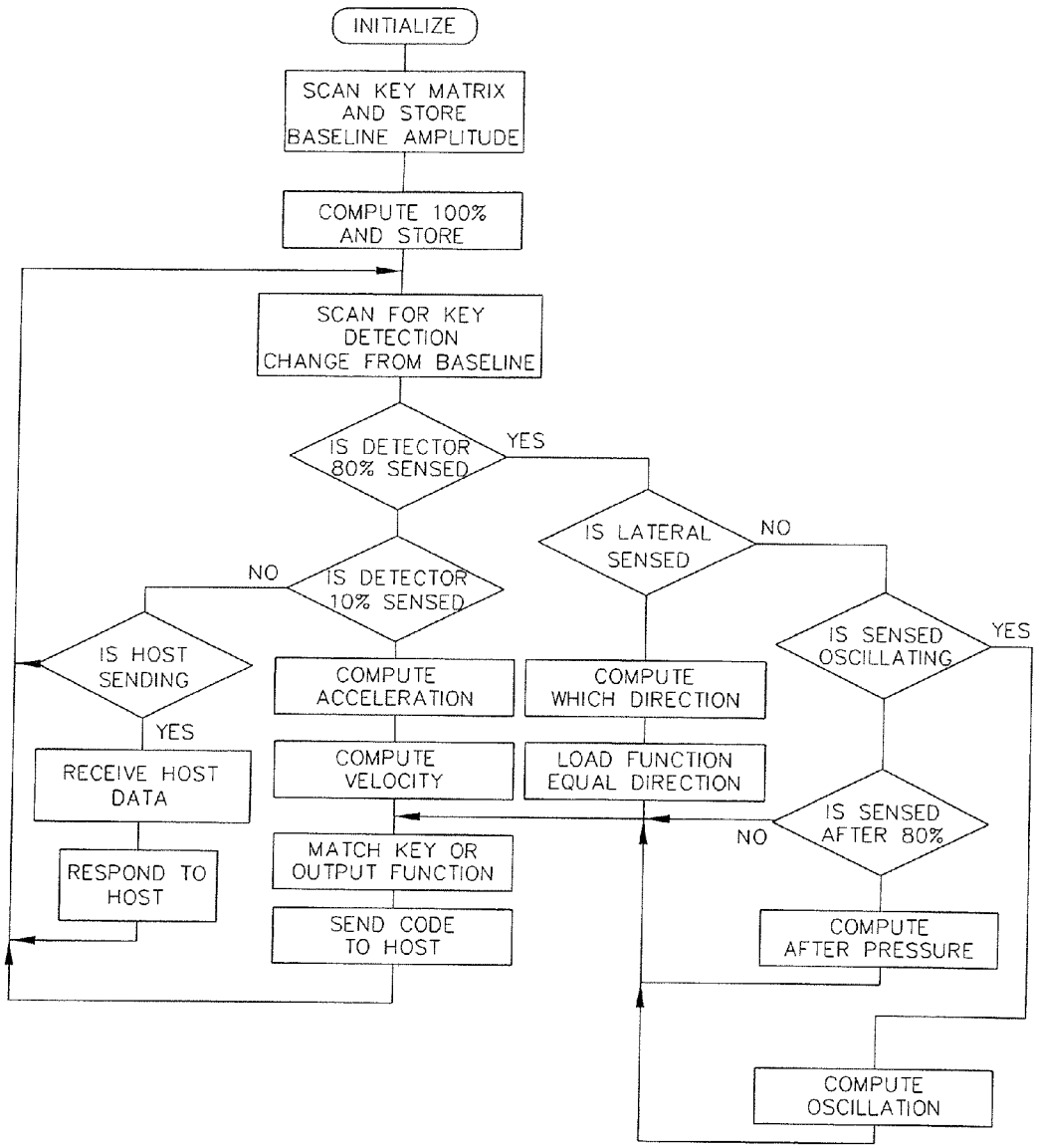
FIG. 25 is a flow diagram illustrating the keyboard functions with key stem and sideward articulation detection in accordance with the teachings of this invention.
Figure 26:
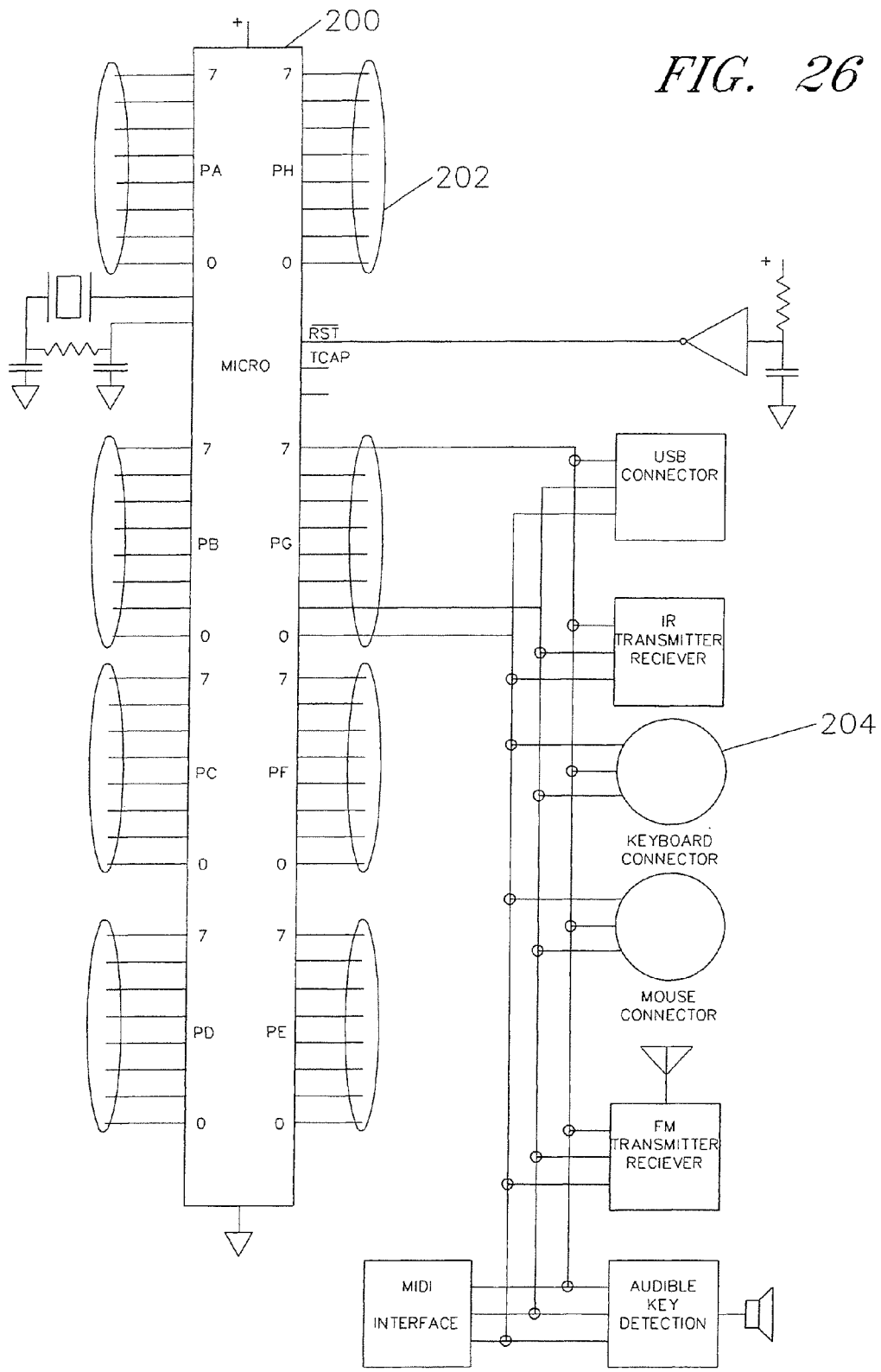
FIG. 26 is a schematic illustrating the microprocessor section of a keyboard with key stem position and sideward articulation detection in accordance with the teachings of this invention.

FIG. 25 is a firmware flow chart showing key detection and detection of velocity, acceleration and sideward or lateral key movement of a keyboard with a plurality of key switches. With a singular key switch there is no firmware needed with the switch it would be provided by the host device, this flow chart is to be used when a plurality of key switches are used on a keyboard. The flow chart is shown being generic and can relate to optical or proximity sensors or pressure sensitive components.

In INITALIZE ports are set to be in either input or output conditions depending on use, ram is tested, and start up sequence with the host is preformed. At SCAN KEY MATRIX a scan is made to store a base line set of vales showing starting point where no keys are pressed. A 100% number is assigned to each detector and is based on the baseline value so all detectors can be computed and said to be equal, in applications where more precise calculations are needed for key articulation then a linearization would need to be done on each sensor and that value put in a table to be called when a percent of amplitude is needed. A scan is made to check if a key has been detected at SCAN FOR KEY. A value of 80%, this value can be changed to match a particular switch or keyboard application need, is used at IS DETECTOR 80% SENSED to see if a key has reached a down or interim position signaling the end of detection or just before after pressure will be tested, if no then a test is made for detector being sensed less than 10% or not sensed at IS DETECTOR 10% SENSED, no then a test is made to see if the host is sending at IS HOST SENDING, if no then a return to SCAN FOR KEY.

If at IS HOST SENDING is yes then RECEIVE HOST DATA, RESPOND TO HOST if necessary and return to SCAN FOR KEY. If at IS DETECTOR 10% SENSED the sensed signal is above 10% then COMPUTE ACCELERATION, by reading and storing the first amplitude, compare with next amplitude and count the time verses amplitude using a percent to equal an acceleration. Then COMPUTE VELOCITY in the same way using a percent to equal Velocity. The MATCH KEY OR OUTPUT FUNCTION to a key or output function and SEND CODE TO HOST in a data string with key code being first and the second being a data byte to equal acceleration and velocity. Those skilled in the art can appreciate that three bytes could be sent, one for each function, key code, acceleration and velocity, or in a computer keyboard where only a key code is needed then only be one byte. These bytes can be either PS2 codes, ASCII codes or a custom code derived for speed of transfer over a standard PS2 link or other data link systems like USB, serial or parallel, or to the 31250 baud MIDI specification.

If yes at IS DETECTOR 80% SENSED a test is made at IS LATERAL SENSED to see if a sideward or lateral articulation is being made. This is done by testing if the side sensors have a change is sensed value. This test could also be made prior to IS DETECTOR 80% SENSED and is advantageous in applications where lateral movement is made for other computer or musical products like a mouse pointing device or for use by a handicap person that cannot produce the force necessary to attain 80% pressure, or in the case of the musical instrument where lateral movement is vibrato and the vibrato is wanted above 80%, or to enter codes or sequences of code like ctrl+C for copy and ctrl+V for paste, any of which can be programmed into the keyboard or computer to be recalled by the keyboard lateral direction. If at IS LATERAL SENSED is yes then COMPUTE WHICH DIRECTION by testing which side or triangulate to see the angled direction, then LOAD FUNCTION EQUAL DIRECTION and go to MATCH KEY OR OUTPUT FUNCTION. If at IS LATERAL SENSED is no then test IS SENSED OSCILLATING to see if the signal is changing, then test IS SENSED AFTER 80% is no then go to MATCH KEY OR OUTPUT FUNCTION. If IS SENSED AFTER 80% is yes then compute after pressure by reading and storing the first amplitude, compare with next amplitude and count the time verses amplitude using a percent to equal after pressure. After pressure is more commonly used in musical instruments when a key is held down, then the musician can press harder and get a louder note, or now with the ever changing need for more function from a computer or keyboard the after pressure can be equated and assigned any function code like a mouse, key, or a series of codes as in ctrl+V for paste. Then go to MATCH KEY OR OUTPUT FUNCTION.

If at IS SENSED OSCILLATING is yes then by computing a oscillation of the amplitude rising and falling at a rate being done at COMPUTE OSCILLATION and got to MATCH KEY OR OUTPUT FUNCTION where a data code value is assigned for the oscillation signature whether it be vibrato or other assigned functions.

FIG. 26 is the micro processor schematic for a keyboard. Keyboard micro processor 200 has various ports under control of the firmware, one such port 202 is shown labeled PH referring to Port H, these ports control the input/output of the keyboard, turning on and off the emitters and detectors, and detecting varying voltage amplitudes from the detectors. One such input/output is shown at keyboard connector 204, others shown are for MIDI, FM, IR, MOUSE and USB.

Figure 27:
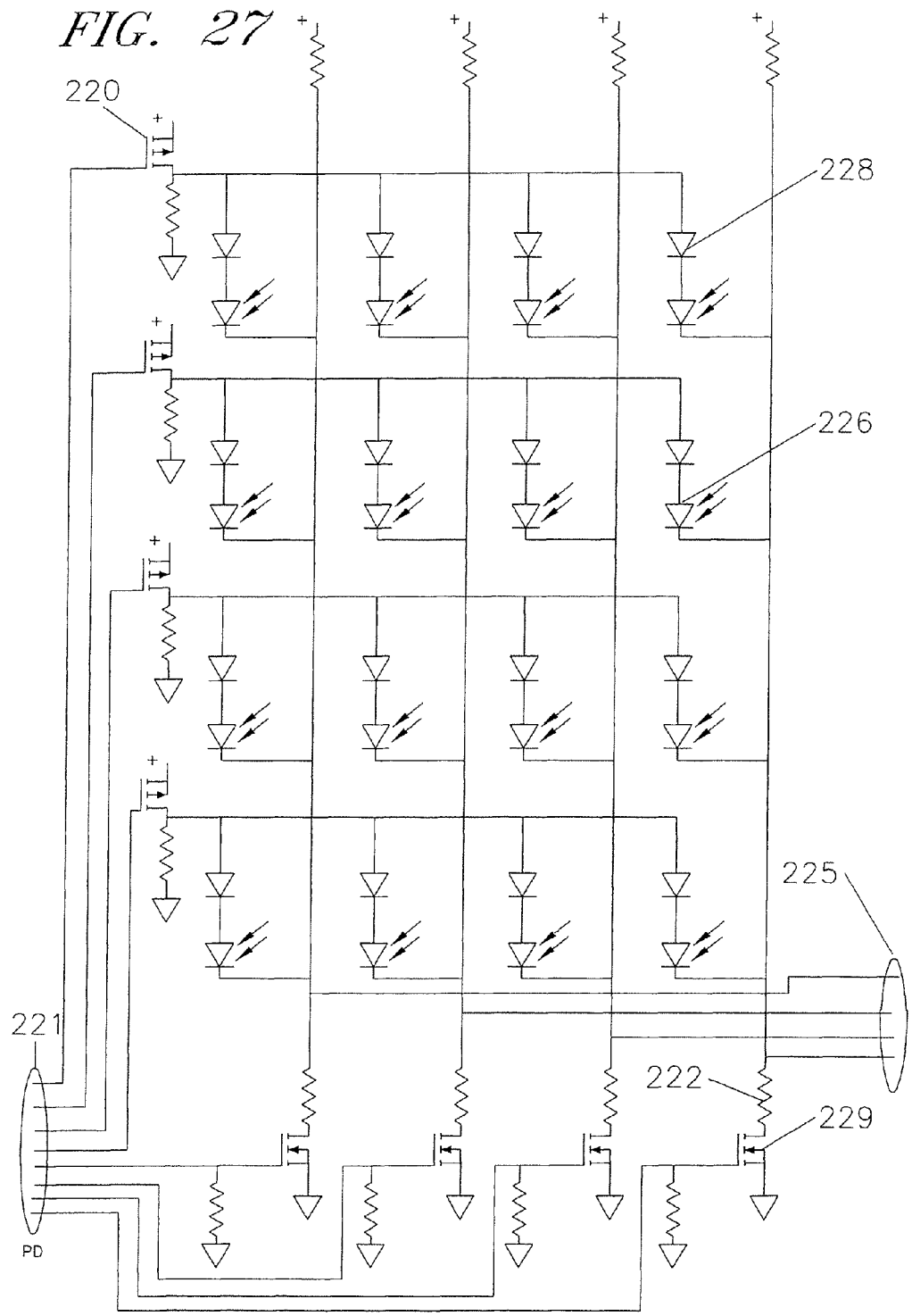
FIG. 27 is a schematic illustrating the elements of a typical optical detector matrix of a keyboard in accordance with the teachings of this invention.
Figure 28:
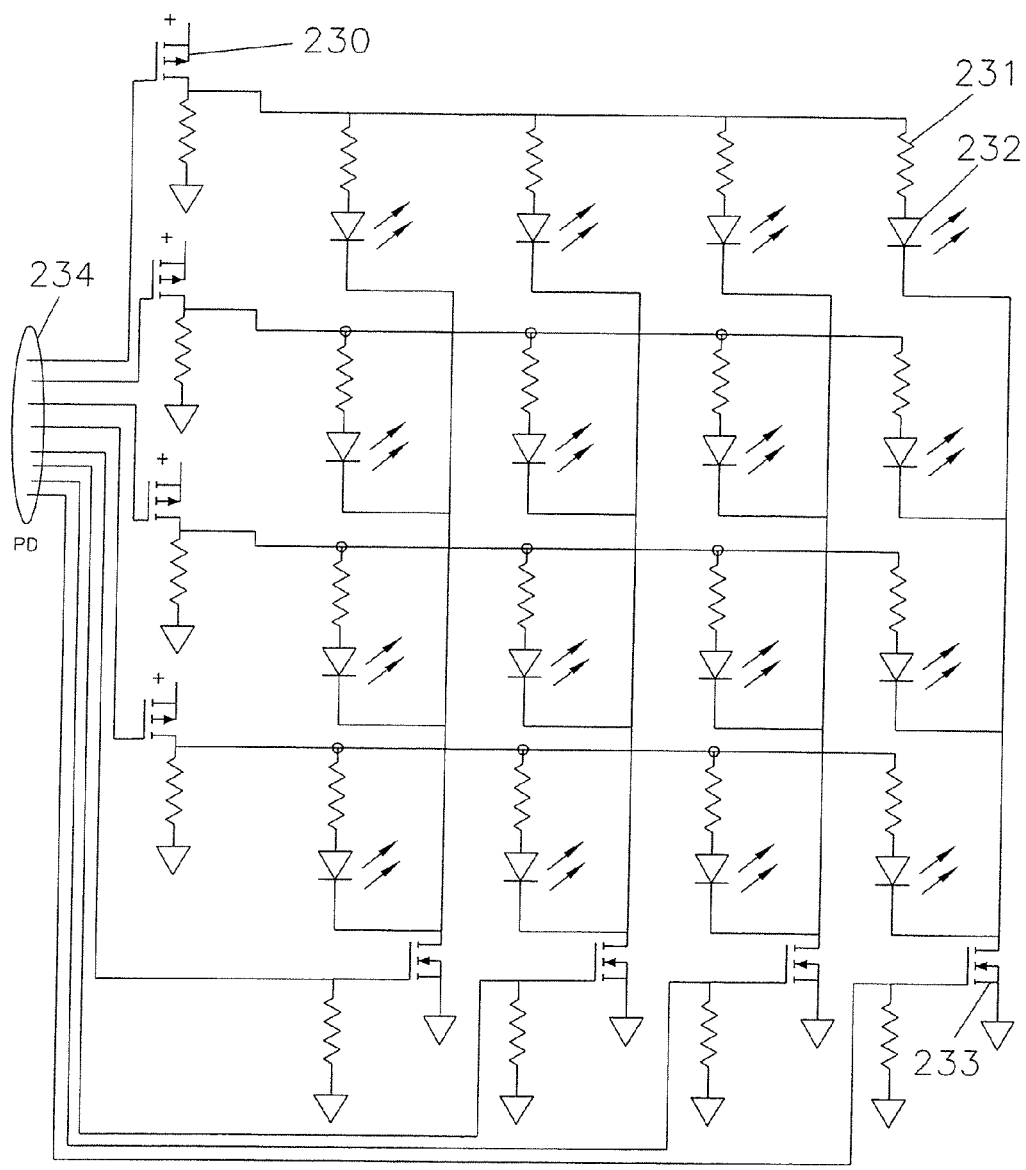
FIG. 28 is a schematic illustrating the elements of a typical optical emitter matrix of a keyboard in accordance with the teachings of this invention.

The quantities of keys vary with different keyboards for different applications as shown in FIG. 16, FIG. 22 and in FIG. 24. FIG. 27 shows a typical detector matrix, and FIG. 28 shows the detectors matching typical emitter matrix, and depending on the number of detectors and emitters needed in a given keyboard these typical matrixes can be decreased or increased to match the application. In operation PFET 220 is turned on to give a positive bias to signal resistor 222 by output port 221, at the same time NFET 229 is turned on to give a negative bias to the cathode of detector 226 by port 221. A voltage amplitude is then seen over A/D resister 222 and at A/D input port 225. This voltage amplitude will then vary depending on the amount of light that is emitted to detector 226. The amount of light that can be emitted to the detector is governed by the position of the key stem, one such is key stem 30 of FIG. 1. If the key stem or interrupter is not depressed then the majority of light from an emitter is received by the detector, then depending on the amount of depression by the user on the key stem varying amounts of light will be seen as voltage amplitude changes at port 225. Isolation diode 228 isolates detector 226 to maintain proper voltage bias.

In FIG. 28 PFET 230 is turned on by port 234 to give a positive bias to emitter 232 through current limiting resistor 231. NFET 233 is then turned on by port 234 the give a negative bias to emitter 232 thus illuminating emitter 232. Using a matrix like is shown in FIG. 27 has two distinct advantages, one being a power saving in overall current drain from the host because the detectors are alternatively turned on, and two, isolating detector emitter pairs to limit cross talk between different detector emitter pairs.

Figure 29:
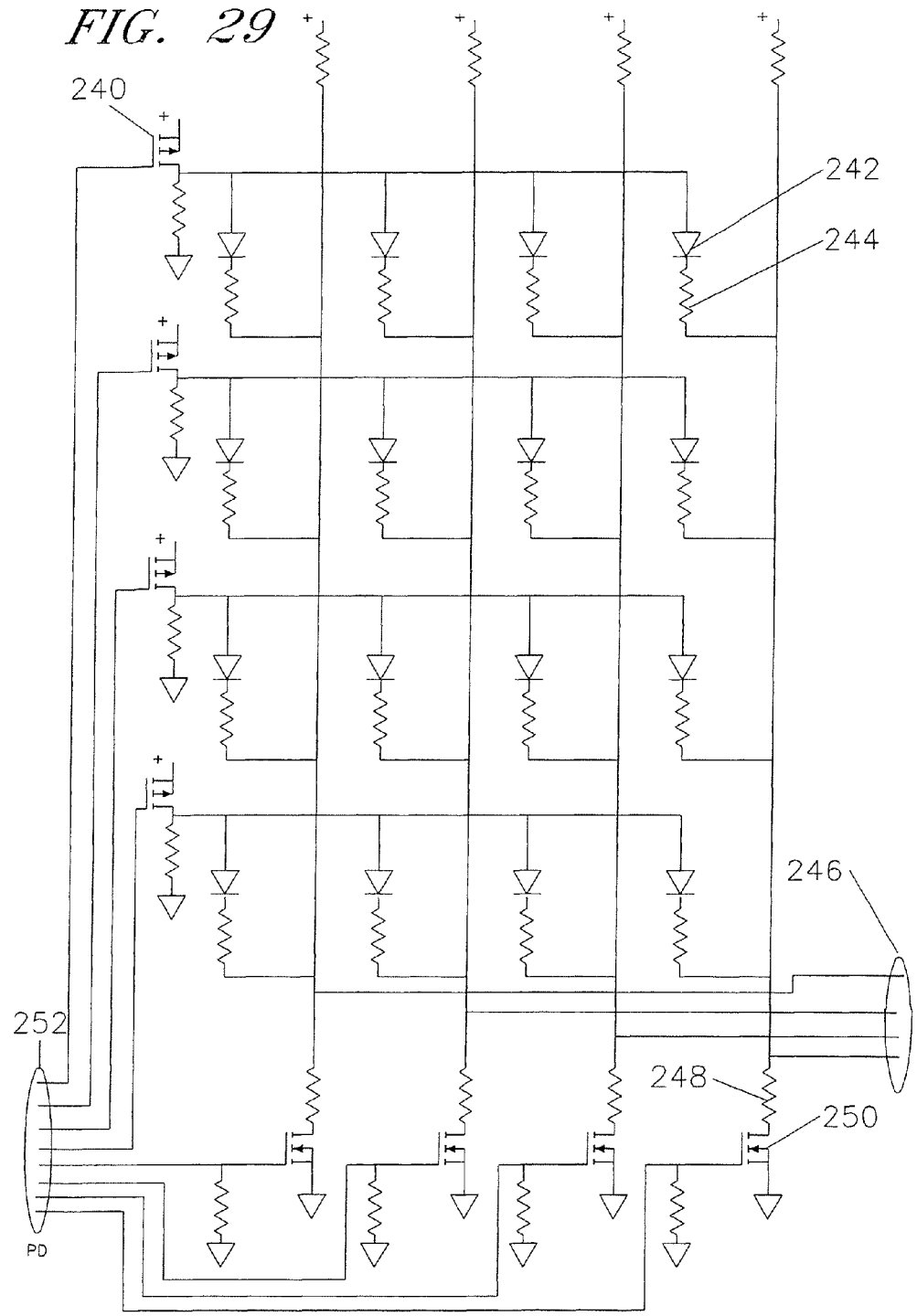
FIG. 29 is a schematic illustrating the elements of a typical pressure sensitive matrix of a keyboard in accordance with the teachings of this invention.

In FIG. 29 it shows a similar sensor matrix as in FIG. 26 with the exception the sensors are pressure sensitive and do not need an opposing emitter matrix. In operation PFET 240 is turned on to give a positive bias to signal resistor 248 by output port 252, at the same time NFET 250 is turned on to give a negative bias sensor 244 by port 252. A voltage amplitude is then seen over A/D resister 248 and at A/D input port 246. This voltage amplitude will then vary depending on the amount of pressure that is applied to the key stem to sensor 244. The amount of pressure that can be applied to the sensor is governed by the position of the key stem. If the key stem is not depressed then there is no pressure on sensor 244, then depending on the amount of depression by the user on the key stem varying amounts of pressure will be seen as voltage amplitude changes at port 246. Isolation diode 242 isolates sensor 244 to maintain proper voltage bias.

Figure 30:
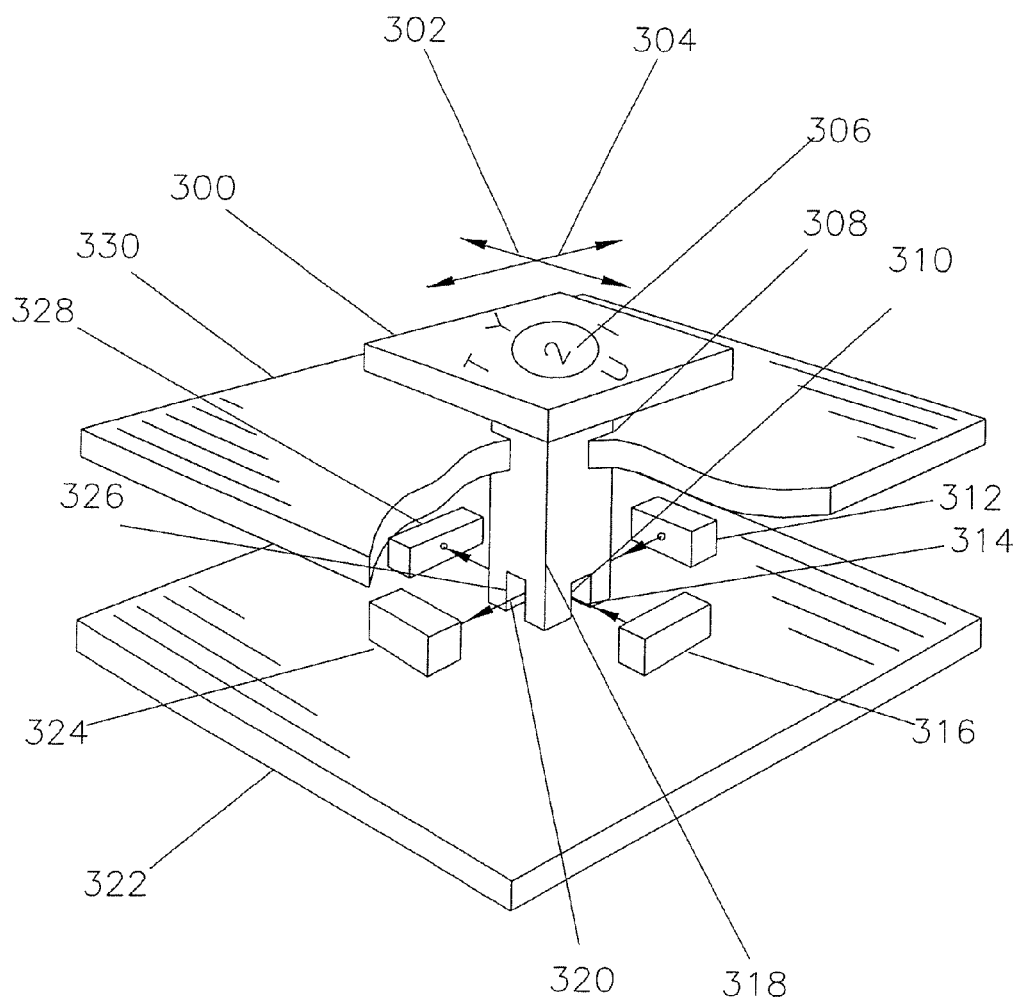
FIG. 30 is a isometric view of a switch having a key stem protruding through an elastomer element to allow the actuating movement in a multidirectional sliding or X and Y direction in accordance with the teachings of this invention.

In FIG. 30 it shows key top 300 with indicia printed thereon. Directional X arrow 304 and Y arrow 302 show the X and Y movement. Key stem 318 protruding through elastomer element 330 is allowed to move in an X and Y direction, and staying on the X and Y plane can move at any angle an operator would choose. Printed wiring board 322 retains emitters 328 and 324, and detectors 316 and 312 which can have control circuitry. Key stem 318 has slots with an X center edge 326 and when in the rest or normal position intersects X beam 320, and at an intersecting angle has slots with a Y center edge 310 and when in the rest or normal position intersects Y beam 314. These center edges intersecting these beams are advantageous to show the direction that the key top 300 and key stem 318 are moving. If X center edge 326 is moved in one direction it starts to block X beam 320 more, if X center edge 326 is moved in the opposite direction X beam 320 is blocked less. So by measuring the amplitude of X beam 320 the direction of key top 300 can be sensed. The same is true of Y center edge 310 and Y beam 314.

Figure 31:
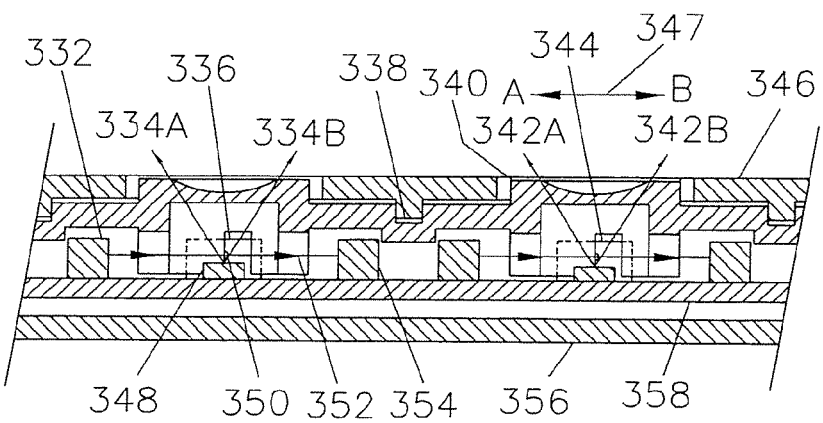
FIG. 31 is a section view of a multidirectional switch in accordance with the teachings of this invention.

FIG. 31 showing a cross section of a slim style of keyboard with an elastomer keys 340 being housed by a top cover 346 and bottom cover 356. Elastomer keys 340 being one piece and positionally retained to a resting position by rib 338 to maintain the alignment over emitter 332 with a light beam 352 being received by detector 354 with an intersecting light beam 350 being received by detector 336 being received by printed wiring board 358 that can have circuitry to control detection of key movemovement. Having rib 338 isolates other adjoined elastomer keys 340 so the movement of one key will not effect another. Elastomer key 340 when moved in the direction of directional arrow 347 attenuates light beam 350 to show direction of movement of elastomer keys 340. Illuminator 348 can emit a light beam 334A to 334B to illuminate a particular key to show depressed and or guide an operator through a sequence of keys, or just be used to illuminate the keyboard.

Figure 32:
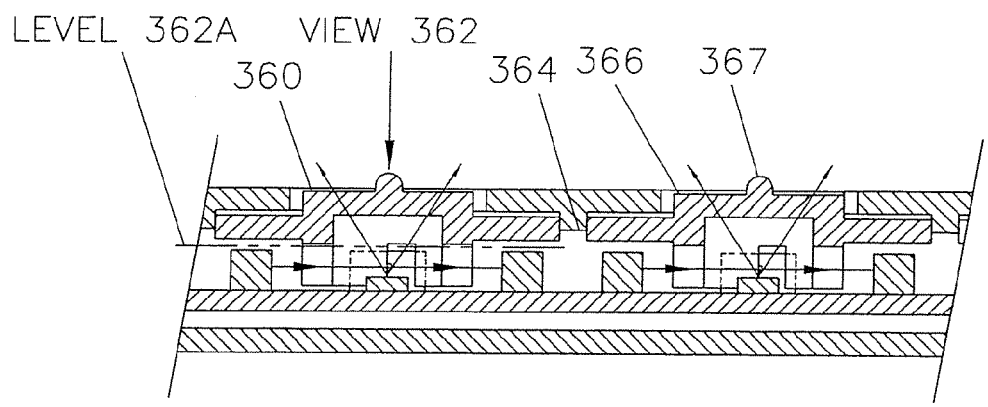
FIG. 32 is a section view of a multidirectional switch in accordance with the teachings of this invention.
Figure 33:
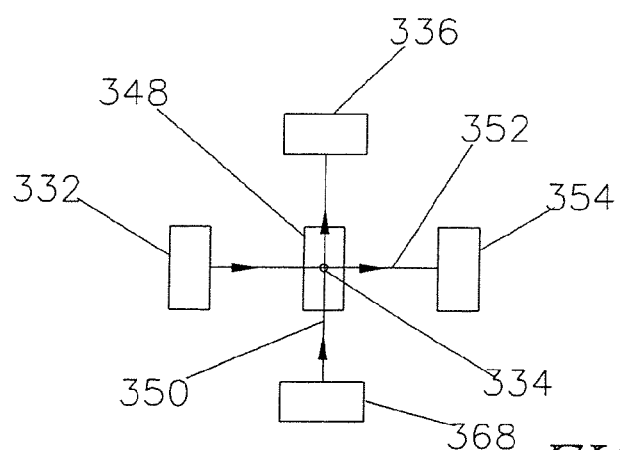
FIG. 33 is a mechanical schematic of the emitters and detectors showing their interrelation with each in accordance with the teachings of this invention.

In FIG. 32 it shows a cross section similar to FIG. 31 except that key 360 is separate from key 366 being positionally retained in a resting position by rib 364. It should be appreciated to those skilled in the art that key 360 being shown as an individual key could be fabricated from a material other than an elastomer, whereas key 360 could be a rigid material with a spring means retaining it in a resting position. Key nib 367 on key 366 can be used to facilitate movement of keys in a lateral direction. View 362 at LEVEL 362A shows the emitter and detector positions as shown in FIG. 33. FIG. 33 is a mechanical schematic of the positions of emitter 332 and 368 with beams 352 and 350 being received by detectors 336 and 354. With illuminator 348 emitting beam 344.

Figure 34:
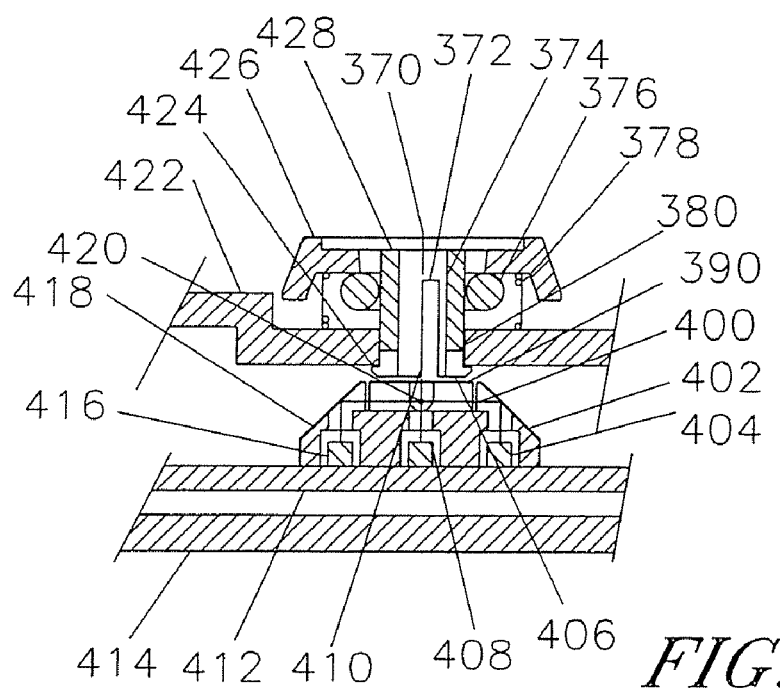
FIG. 34 is a cross section of a switch with X, Y and Z directional movement in accordance with the teachings of this invention.

FIG. 34 shows a key and detection means to detect movement in the X, Y and Z directions. Key 428 is retained in upper housing 422 by snaps 424 with spring 378 holding key 426 in a non-depressed position. Recess 428 can be used to retain removable indicia. Slot 372 with a center edge 370 attenuates beam 420 to show direction of movement of key 426. Elastomer ring 376 gives a first stop for showing when key 426 has reached a first stop. Quad mirror support 390 supports mirrors 418 and 402 to direct beam 400 from emitter 404 to detector 416 being received on printed wiring board 412, and cover by bottom cover 414. Illuminator 408 with beam 410 illuminates key 426 through key opening 374. Down position top slot 380 attenuates beam 400 when key 426 reaches first stop position when elastomer ring 376 is in first stop against top cover 422, then when key 426 is further depressed elastomer ring 376 becomes oblong and further attenuates beam 400. This is advantageous so velocity can be sensed of key 426 by timing the time key 426 starts to attenuate beam 420 and beam 420 until elastomer ring 376 contacts upper housing 422, then after pressure is sensed from the continuing pressure and the amount of compression of elastomer ring 376.

Figure 35:
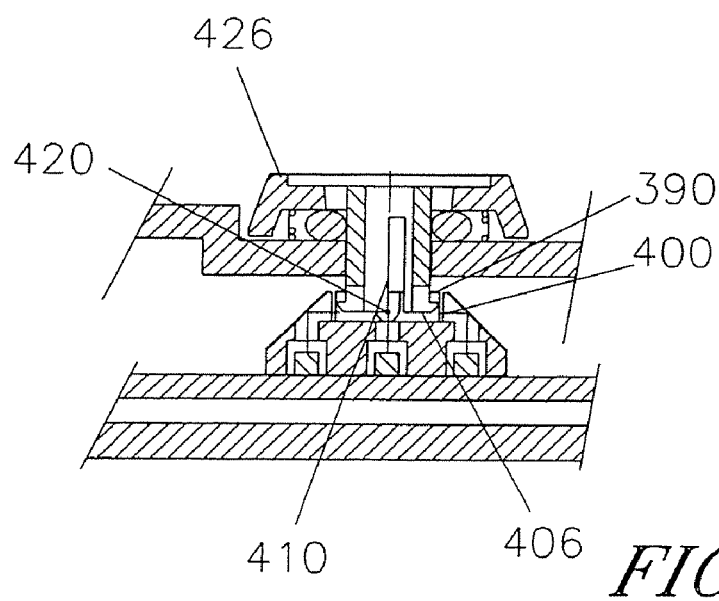
FIG. 35 is a cross section of a switch with X, Y and Z directional movement in the depressed condition in accordance with the teachings of this invention.

FIG. 35 shows a cross section of the switch in FIG. 34 in a depressed condition with key 426 lower surface 406 attenuating beam 400.

Figure 36:
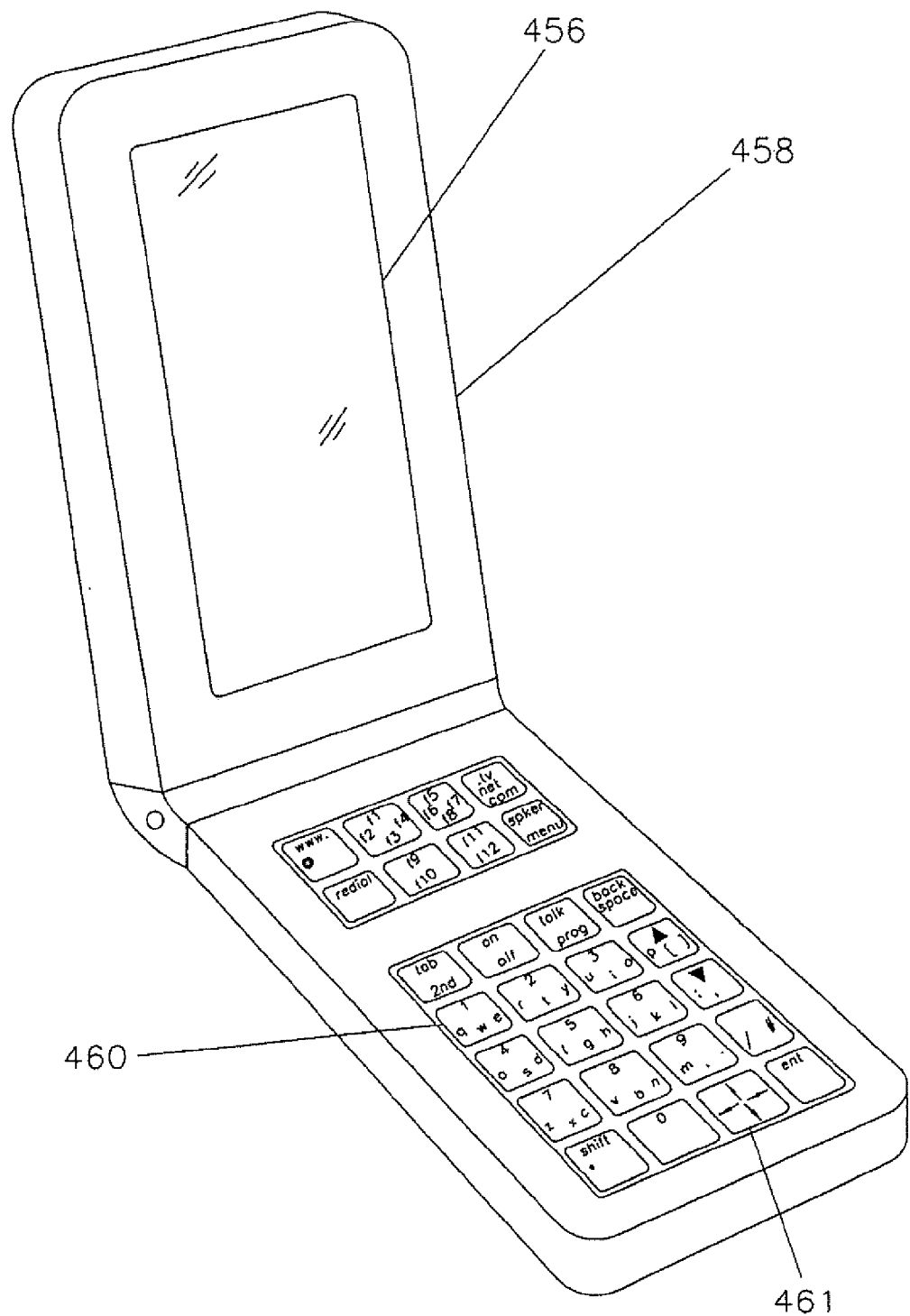
FIG. 36 is a isometric view of a mobile device with a keyboard and display in accordance with the teachings of this invention.

FIG. 36 shows a mobile device with housing 458 and display 456, and a pattern of keys as in FIG. 31 and FIG. 32. Mouse positioning key 461 having X and Y sensing can by triangulation using the beam 350 and beam 352 of FIG. 31 can position a mouse cursor on display 456.

Figure 37:
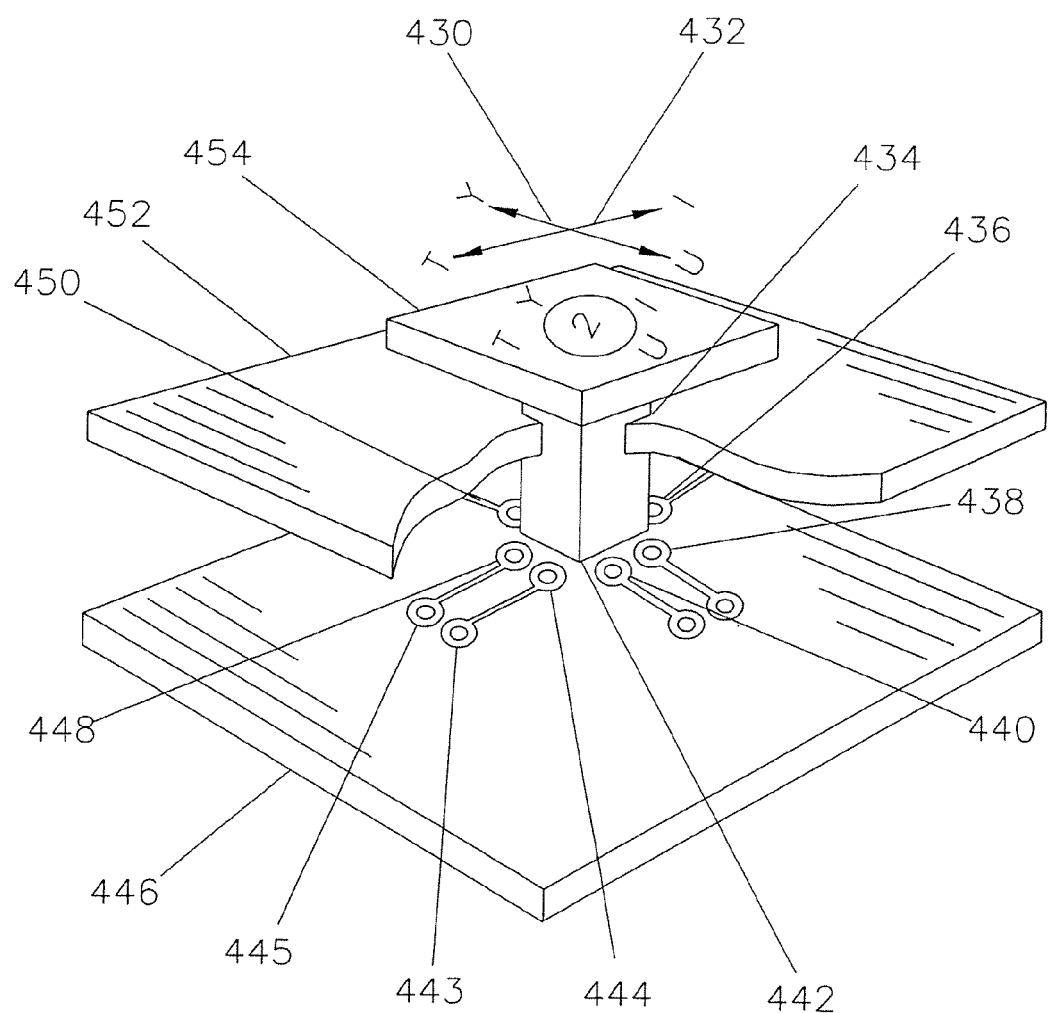
FIG. 37 is a isometric view of a switch with X and Y sliding movement in accordance with the teachings of this invention.

FIG. 37 shows a key 454 being held in elastomer 452 to retain key 454 in a resting position while still allows key 454 to move. Key 454 with a conductive lower surface 442 that when moved in direction 432 "T" connects printed wiring board traces 448 and 444 resulting in connection of circuits connected to pads 445 and 443 that can be connected to a control circuit for detecting key 454 direction. When key 454 is moved in direction 430 U is connects traces 438 and 440 resulting is key 454 movement in the direction 430 "U" direction. Pad 436 is used to detect key 454 movement in direction 432 "T", and pad 450 is used to detect key 454 movement in the direction 430 "Y" direction. When key 454 is moved in a forty five degree direction then it would connect both sets of pads associated with that direction. As in if key 454 was positioned in the direction of 430 "U" and 432 "T" it would connect traces 448, 444, 440 and 438 and show a forty five degree movement in that direction thus giving a triangulation showing direction. It should be appreciated to those skilled in the art that traces 448 and 444 could be different shapes or sizes and still function as contacts. It should also be appreciated to those skilled in the art that conductive surface 442 could be a carbon deposit or a separate and different material than key 454 is fabricated from.

Figure 38:
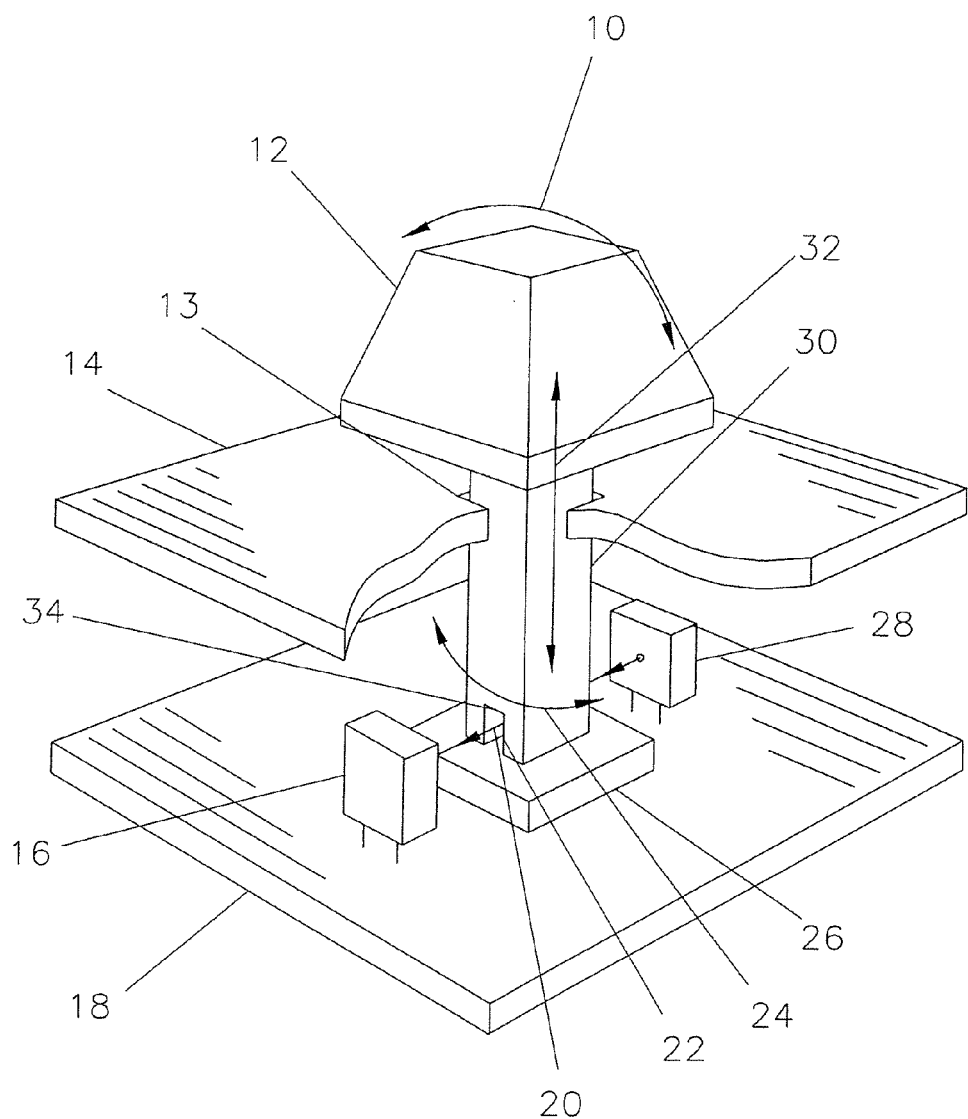
FIG. 38 is an isometric view of a optical switch having a key and stem protruding through a pivot and sliding surface with optical position and sideward detection and a tension element for resistance in a downward direction in accordance with the teachings of this invention.

FIG. 38 shows a top surface 14 with pivot and sliding opening 13 allowing key stem 30 to slide in an up down direction as shown by up down arrow 32 and pivot or be sideward articulated as shown by upper lateral arrow 10. Key stem 30 having an optical opening 22 with optical opening top 34. When key stem 30 moves in a downward direction optical opening 22 with sides that straddle light beam 20 and allows light beam 20 to pass through until optical opening top 34 attenuates light beam 20 giving the position of stem 30. Emitter 28 and detector 16 can be mounted on printed wiring board 18 that can have circuitry to modulate the on and off conditions of each. Elastomeric pad 26 is disposed on printed wiring board 18. When elastomeric pad 26 or tension element is contacted by key stem 30, key cap 12 can be pivoted in a sideward direction. The resultant pivot direction of key stem 30 from upper lateral arrow 10 is shown by lower lateral arrow 24 and the sides of optical opening 22 modifies the resultant emitence of light beam 20 emitted from emitter 28 and incident on detector 16. The clearance between key stem 30 and pivot and sliding opening 13 can be matched to a users preference in as much as more clearance to get more angle of pivot to less clearance to get less angle of movement. At any time from when light beam 20 starts to be attenuated measurements can be made from that point until or during resistance has been felt by elastomeric pad 26 to equal velocity and acceleration from an operator pushing key cap 12. From the point that resistance is felt measurements can be made that can equal after pressure optically, or the amount of compression elastomeric pad 26 is being compressed optically. Tension elements like elastomeric pad 26 can be made from different durometer elastomers or other spring type components to give the feel conducive to an operator's preference. After pressure can be plus or minus so if the operator presses harder then softer the distance traveled can be equated to a computer function or when used in a musical instrument a louder or softer tone or note. It should be appreciated by those skilled in the art that the elements shown in FIG. 38 could be replicated to form a multi key keyboard.

Elastomeric pad 26 is not a requirement to be used to detect the depth in position of key stem 30, in some systems it may just be a stop to stop the downward motion of key cap 12. If elastomeric pad 26 is not used depth can be measured through the attenuated range of optical beam 20, velocity from a point to a point can be measured, and acceleration can be measured because all measurements are in distance. This can be advantageous for an operator to use position in place of pressure, as in musical notes from a Trombone where notes are from the position of the slide, or for a handicap person that cannot apply a force sensing elements required force to get a pleasing output.

The tension element elastomeric pad 26 can be of the type used in FIG. 6 where that elastomeric pad 72 is placed in the key cap 12.

When key cap 12 is pivoted or oscillated in a sideward direction light beam 20 will be attenuated by the sides of optical opening 22 and can be measured as a distance to give acceleration and velocity, these measurements can equal a computer function or when playing music it can equal a vibrato effect. This is advantageous when oscillated to be able to have music actually sound as if it was coming from an actual musical instrument where sideward movement of a musicians fingers affect the mouth piece mouth relationship giving a varying intensity or vibrato effect. This is also advantageous when pivoted by a computer operator to input a function, like pivot the keyboard key to the left and get Ctrl+V to paste, and pivot the key to the right and get Ctrl+C to copy. When switch of FIG. 38 is used in a keyboard in plurality each key could output the same code or sequence of codes allowing ctrl+C or ctrl+V or any other code or sequence available with any typing finger while inputting data or playing music.

Figure 39:
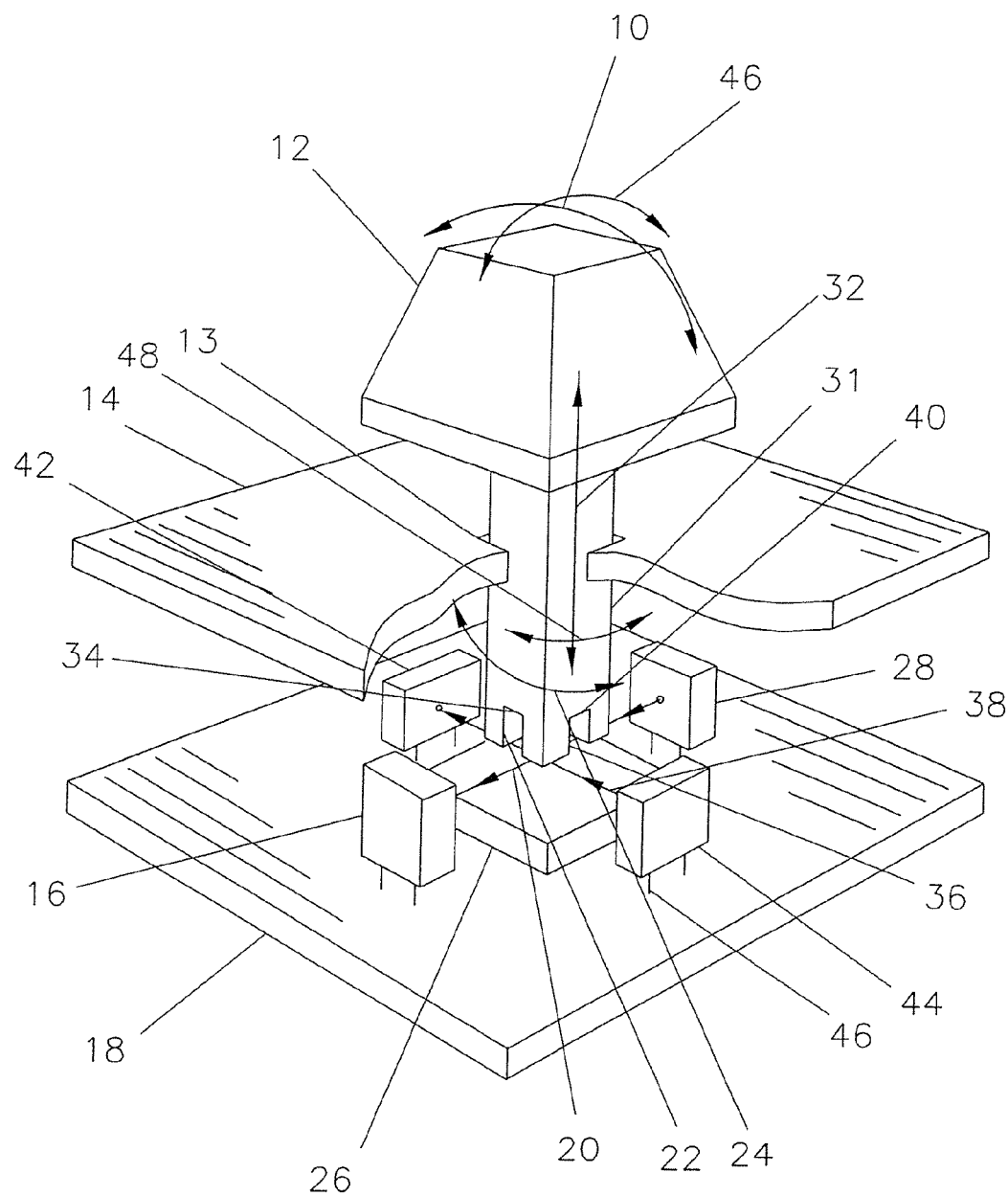
FIG. 39 is an isometric view of a optical switch having a key and stem protruding through a pivot and sliding surface with separate optical position and sideward detection and a tension element for resistance in a downward direction in accordance with the teachings of this invention.

FIG. 39 having the similar elements as FIG. 38 with the addition of a second emitter 44 and second detector 42 having a second optical beam 38 there between being attenuated in the up down direction by second optical opening top 40 in key stem 31 and attenuated in the front to back direction shown by upper front back arrow 46 giving a resultant movement in direction shown by lower front back arrow 48 by second optical opening 36. Having two emitter detector pairs bi-directional alignment allows selection of computer or musical functions in four directions or by triangulation in multiple directions, and when the output is directed to a mouse port can give cursor control.

Figure 40:
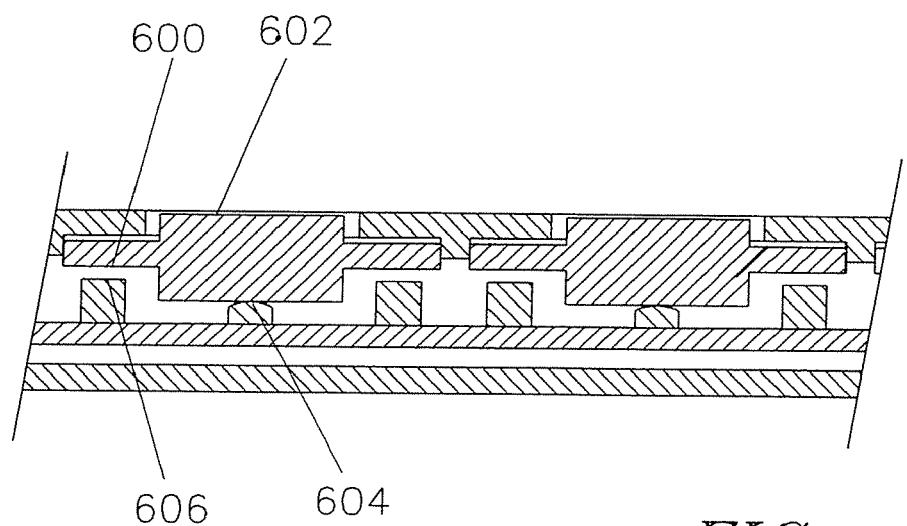
FIG. 40 is a cross section of a switch with multidirectional movement in accordance with the teachings of this invention.

FIG. 40 is a cross section of a switch with multidirectional movement where pivot 604 allows conductive key 602 with a contact surface 600 to connect to contact 606 when conductive key 602 is pivoted toward contact 606.

Figure 41:
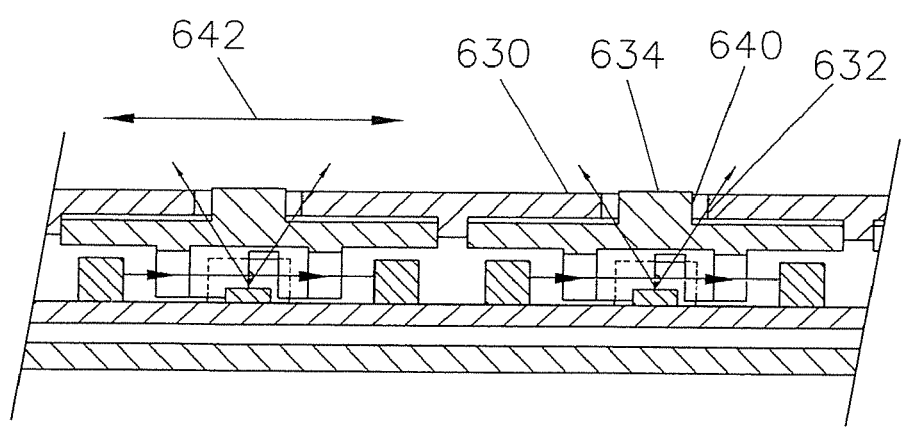
FIG. 41 is a section view of a multidirectional switch in accordance with the teachings of this invention.

FIG. 41 showing a cross section of a slim style of keyboard with housing 630 of FIG. 1 and one of multidirectional keys 634 with a key edge 640 that can be restricted in movement buy key opening 632. Key movement plane 642 shows the plane of three hundred and sixty degree movement that multidirectional keys 634 can be directed for detection.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A multi-directional keypad switch, comprising
   a keypad housing with a top surface; a lower mount surface;
   an emitter and detector disposed on said lower mount surface, said emitter and detector configured to permit said emitter to emit a light beam towards said detector; and
   a key with a top surface exposed to operate said key, said key being slidable in a lateral direction parallel to said top surface, said key having a bottom surface with a slot perpendicular to said top surface;
   wherein said slot in said bottom surface of said key is positioned to straddle said light beam emitted by said emitter,
   wherein sides of said slot in said bottom surface are perpendicular to said lower mount surface, said sides of said slot in said bottom surface attenuate substantially half of said light beam when said key is in a central position;
   wherein when said key is moved in a lateral direction from said central position that is substantially ninety degrees to said light beam, said light beam is laterally attenuated by said sides of said slot in said bottom surface of said key in an amount greater than substantially half of said light beam;
   wherein said detector detects an amount of lateral attenuation of said light beam and based on said amount of lateral attenuation said detector determines a lateral position of said key in said light beam, said emitter and detector being configured for detecting a plurality of different amounts of lateral attenuation varying form a first amount where substantially half of said light beam is attenuated to a second amount where greater than substantially half of said light beam is attenuated and can detect at least one lateral position of said key stem based on an amount of lateral attenuation that is between said first amount and said second amount.

2. The multi-directional keypad switch of claim 1, further comprising:
   a second emitter and a second detector disposed on said lower mount surface substantially ninety degrees relative to said emitter and said detector, said second emitter and said second detector configured to permit said second emitter to emit a second light beam towards said second detector; and
   wherein said bottom surface of said key includes a second slot perpendicular to said top surface;
   wherein said second slot in said bottom surface of said key is positioned to straddle said second light beam emitted by said second emitter,
   wherein sides of said second slot in said bottom surface are perpendicular to said lower mount surface, said sides of said second slot in said bottom surface attenuate substantially half of said second light beam when said key is in said central position,
   wherein when said key is moved in a lateral direction from said central position that is substantially ninety degrees to said second light beam, said second light beam is laterally attenuated by said sides of said second slot in said bottom surface of said key, wherein said second detector detects an amount of lateral attenuation of said second light beam and based on said amount of lateral attenuation said second detector determines a lateral position of said key in said second light beam, said lateral attenuation equates to one or more lateral positions of said key at least one of which is a lateral position prior to said key reaching a point where lateral attenuation stops.

3. The multi-directional keypad switch of claim 1, wherein said key is translucent; and further comprising a light emitting diode disposed on said lower mount surface to emit illuminating light through said key.

4. The multi-directional keypad switch of claim 2, wherein said key is configured to be moved laterally to positions where both said light beam and said second light beam are attenuated at the same time, and further comprising a means to triangulate the position of said key based on output from said detector and said second detector.

5. A keypad which can be used to enter numbers, alphabet letters, or symbols using a plurality of keys where the keys are arranged to mimic a "'qwerty" keyboard, comprising:

nine keys arranged in three rows of three keys each where the three keys of said three rows are arranged in columns, said three rows constituting a top row, a middle row, and a bottom row, wherein each key of said nine keys has a top surface which has a plurality of letters thereon, and wherein each of said nine keys are slidable in at least two different directions parallel to said top surface from a resting position, wherein said three keys in said top row indicate at least nine of ten letters of a top row of a "qwerty" keyboard and indicate at least nine of letters Q, W, E, R, T, Y, U, I, O, and P, wherein said three keys in said middle row indicate nine letters of a middle row of a "qwerty" keyboard and indicate letters A, S, D, F, G, H, J, K and L, wherein said three keys in said bottom row indicate seven letters of a bottom row of a "qwerty" keyboard and indicate letters Z, X, C, V, B, N, and M, wherein each of said nine keys are positioned in a keypad housing with a top surface and a lower mount surface, and wherein each of said nine keys includes a key stem extending from said top surface of said keypad housing towards said lower mount surface;

one or more emitters and detectors disposed on said lower mount surface, said one or more emitters and detectors configured to permit said one or more emitters to emit a light beam towards said one or more detectors;

wherein each of said nine keys has a bottom surface with a slot perpendicular to said top surface;

wherein said slot in said bottom surface of each of said nine keys is positioned to straddle said light beam emitted by said one or more emitters, wherein sides of said slot in said bottom surface are perpendicular to said lower mount surface, said sides of said slot in said bottom surface attenuate substantially half of said light beam when said key is in a central position;

wherein when one or more of said nine keys is moved in a lateral direction from said central position that is substantially ninety degrees to said light beam, said light beam is laterally attenuated by said sides of said slot in said bottom surface in an amount greater than substantially half of said light beam;

wherein said one or more detectors detects an amount of lateral attenuation of said light beam and based on said amount of lateral attenuation said one or more detectors determines a lateral position of said key in said light beam, said one or more detector being configured for detecting a plurality of different amounts of lateral attenuation varying from a first amount where substantially half of said light beam is attenuated to a second amount where greater than substantially half of said light beam is attenuated, and can detect at least one lateral position of said key stem based on an amount of lateral attenuation that is between said first amount and said second amount; and a one or more second emitters and one or more second detectors disposed on said lower mount surface substantially ninety degrees relative to said one or more emitters and said one or more detectors, said one or more second emitters and said one or more second detectors configured to permit said one or more second emitters to emit a second light beam towards said one or more second detectors; and wherein said bottom surface of each of said nine keys includes a second slot perpendicular to said top surface;

wherein said second slot in said bottom surface is positioned to straddle said second light beam emitted by said one or more second emitters, wherein sides of said second slot in said bottom surface are perpendicular to said lower mount surface, said sides of said second slot in said bottom surface attenuate substantially half of said second light beam when said key is in said central position, wherein when said key is moved in a lateral direction from said central position that is substantially ninety degrees to said second light beam, said second light beam is laterally attenuated by said sides of said second slot in said bottom surface of said key, wherein said second detector detects an amount of lateral attenuation of said second light beam and based on said amount of lateral attenuation said second detector determines a lateral position of said key in said second light beam, said lateral attenuation equates to one or more lateral positions of said key at least one of which is a lateral position prior to said key reaching a point where lateral attenuation stops.

* * * * *